US009159627B2

(12) United States Patent
Smayling et al.

(10) Patent No.: US 9,159,627 B2
(45) Date of Patent: Oct. 13, 2015

(54) METHODS FOR LINEWIDTH MODIFICATION AND APPARATUS IMPLEMENTING THE SAME

(75) Inventors: Michael C. Smayling, Fremont, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

(21) Appl. No.: 13/373,470

(22) Filed: Nov. 14, 2011

(65) Prior Publication Data

US 2012/0118854 A1   May 17, 2012

Related U.S. Application Data

(60) Provisional application No. 61/413,284, filed on Nov. 12, 2010.

(51) Int. Cl.
| | | |
|---|---|---|
| *H01L 21/311* | (2006.01) | |
| *C23F 1/02* | (2006.01) | |
| *H01L 21/8234* | (2006.01) | |
| *H01L 21/033* | (2006.01) | |
| *H01L 21/3213* | (2006.01) | |

(52) U.S. Cl.
CPC .... *H01L 21/823456* (2013.01); *H01L 21/0337* (2013.01); *H01L 21/0338* (2013.01); *H01L 21/32139* (2013.01)

(58) Field of Classification Search
USPC .............. 438/694, 706, 710; 216/37, 58, 67
See application file for complete search history.

(56) References Cited

U.S. PATENT DOCUMENTS

| | | |
|---|---|---|
| 4,197,555 A | 4/1980 | Uehara et al. |
| 4,417,161 A | 11/1983 | Uya |
| 4,424,460 A | 1/1984 | Best |
| 4,613,940 A | 9/1986 | Shenton et al. |
| 4,657,628 A | 4/1987 | Holloway et al. |
| 4,682,202 A | 7/1987 | Tanizawa |

(Continued)

FOREIGN PATENT DOCUMENTS

| | | |
|---|---|---|
| EP | 0102644 | 7/1989 |
| EP | 0788166 | 8/1997 |

(Continued)

OTHER PUBLICATIONS

U.S. Appl. No. 60/625,342, filed May 25, 2006, Pileggi et al.

(Continued)

*Primary Examiner* — Shamim Ahmed
(74) *Attorney, Agent, or Firm* — Martine Penilla Group, LLP

(57) ABSTRACT

A linear-shaped core structure of a first material is formed on an underlying material. A layer of a second material is conformally deposited over the linear-shaped core structure and exposed portions of the underlying material. The layer of the second material is etched so as to leave a filament of the second material on each sidewall of the linear-shaped core structure, and so as to remove the second material from the underlying material. The linear-shaped core structure of the first material is removed so as to leave each filament of the second material on the underlying material. Each filament of the second material provides a mask for etching the underlying material. Each filament of the second material can be selectively etched further to adjust its size, and to correspondingly adjust a size of a feature to be formed in the underlying material.

13 Claims, 24 Drawing Sheets

(56) References Cited

U.S. PATENT DOCUMENTS

| | | |
|---|---|---|
| 4,745,084 A | 5/1988 | Rowson et al. |
| 4,780,753 A | 10/1988 | Ohkura et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,798,298 A | 8/1998 | Yang et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,159,839 A | 12/2000 | Jeng et al. |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin |
| 6,505,328 B1 | 1/2003 | van Ginneken et al. |

(56) References Cited

U.S. PATENT DOCUMENTS

| | | |
|---|---|---|
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi et al. |
| 6,571,379 B2 | 5/2003 | Takayama |
| 6,574,786 B1 | 6/2003 | Pohlenz et al. |
| 6,578,190 B2 | 6/2003 | Ferguson et al. |
| 6,583,041 B1 | 6/2003 | Capodieci |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,621,132 B2 | 9/2003 | Onishi et al. |
| 6,632,741 B1 * | 10/2003 | Clevenger et al. ............ 438/689 |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,690,206 B2 | 2/2004 | Rikino et al. |
| 6,691,297 B1 | 2/2004 | Misaka et al. |
| 6,700,405 B1 | 3/2004 | Hirairi |
| 6,703,170 B1 | 3/2004 | Pindo |
| 6,709,880 B2 | 3/2004 | Yamamoto et al. |
| 6,714,903 B1 | 3/2004 | Chu et al. |
| 6,732,334 B2 | 5/2004 | Nakatsuka |
| 6,732,338 B2 | 5/2004 | Crouse et al. |
| 6,732,344 B2 | 5/2004 | Sakamoto et al. |
| 6,734,506 B2 | 5/2004 | Oyamatsu |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 | 7/2004 | Bansal |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,807,663 B2 | 10/2004 | Cote et al. |
| 6,809,399 B2 | 10/2004 | Ikeda et al. |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,820,248 B1 | 11/2004 | Gan |
| 6,826,738 B2 | 11/2004 | Cadouri |
| 6,834,375 B1 | 12/2004 | Stine et al. |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,867,073 B1 | 3/2005 | Enquist |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Van Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |
| 6,921,982 B2 | 7/2005 | Joshi et al. |
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park et al. |
| 6,992,925 B2 | 1/2006 | Peng |
| 6,993,741 B2 | 1/2006 | Liebmann et al. |
| 6,994,939 B1 | 2/2006 | Ghandehari et al. |
| 7,003,068 B2 | 2/2006 | Kushner et al. |
| 7,009,862 B2 | 3/2006 | Higeta et al. |
| 7,016,214 B2 | 3/2006 | Kawamata |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,413 B2 | 7/2006 | Tsukamoto et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,185,294 B2 | 2/2007 | Zhang |
| 7,188,322 B2 | 3/2007 | Cohn et al. |

(56) References Cited

U.S. PATENT DOCUMENTS

| | | | |
|---|---|---|---|
| 7,194,712 B2 | 3/2007 | Wu |
| 7,200,835 B2 | 4/2007 | Zhang et al. |
| 7,202,517 B2 | 4/2007 | Dixit et al. |
| 7,205,191 B2 | 4/2007 | Kobayashi |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,264,990 B2 | 9/2007 | Rueckes et al. |
| 7,266,787 B2 | 9/2007 | Hughes et al. |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,424,696 B2 | 9/2008 | Vogel et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,492,013 B2 | 2/2009 | Correale, Jr. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Blatchford et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 | 1/2011 | Kahng et al. |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,932,544 B2 | 4/2011 | Becker et al. |
| 7,932,545 B2 | 4/2011 | Becker et al. |
| 7,934,184 B2 | 4/2011 | Zhang |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |

(56) References Cited

U.S. PATENT DOCUMENTS

| | | |
|---|---|---|
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,395,224 B2 | 3/2013 | Becker et al. |
| 8,402,397 B2 | 3/2013 | Robles et al. |
| 8,405,163 B2 | 3/2013 | Becker et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 8,575,706 B2 | 11/2013 | Becker et al. |
| 8,667,443 B2 | 3/2014 | Smayling et al. |
| 8,701,071 B2 | 4/2014 | Kornachuk et al. |
| 8,735,995 B2 | 5/2014 | Becker et al. |
| 8,756,551 B2 | 6/2014 | Becker et al. |
| 8,836,045 B2 | 9/2014 | Becker et al. |
| 8,839,162 B2 | 9/2014 | Amundson et al. |
| 8,839,175 B2 | 9/2014 | Smayling et al. |
| 8,847,329 B2 | 9/2014 | Becker et al. |
| 8,863,063 B2 | 10/2014 | Becker et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0068423 A1 | 6/2002 | Park et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0103176 A1 | 6/2003 | Abe et al. |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0203287 A1 | 10/2003 | Miyagawa |
| 2003/0229868 A1 | 12/2003 | White et al. |
| 2003/0229875 A1 | 12/2003 | Smith et al. |
| 2004/0029372 A1 | 2/2004 | Jang et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0164360 A1 | 8/2004 | Nishida et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen et al. |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato et al. |
| 2005/0266621 A1* | 12/2005 | Kim .......................... 438/151 |
| 2005/0268256 A1 | 12/2005 | Tsai et al. |
| 2005/0278673 A1 | 12/2005 | Kawachi |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |

(56) References Cited

U.S. PATENT DOCUMENTS

| | | |
|---|---|---|
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2007/0001304 A1 | 1/2007 | Liaw |
| 2007/0002617 A1 | 1/2007 | Houston |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0186196 A1 | 8/2007 | Tanaka |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0234262 A1 | 10/2007 | Uedi et al. |
| 2007/0256039 A1 | 11/2007 | White |
| 2007/0257277 A1 | 11/2007 | Takeda et al. |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0005712 A1 | 1/2008 | Charlebois et al. |
| 2008/0021689 A1 | 1/2008 | Yamashita et al. |
| 2008/0022247 A1 | 1/2008 | Kojima et al. |
| 2008/0046846 A1 | 2/2008 | Chew et al. |
| 2008/0081472 A1 | 4/2008 | Tanaka |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0098341 A1 | 4/2008 | Kobayashi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1* | 3/2009 | Ban et al. ............ 438/751 |
| 2009/0077524 A1 | 3/2009 | Nagamura |
| 2009/0085067 A1 | 4/2009 | Hayashi et al. |
| 2009/0087991 A1* | 4/2009 | Yatsuda et al. ............ 438/694 |
| 2009/0101940 A1 | 4/2009 | Barrows et al. |
| 2009/0106714 A1 | 4/2009 | Culp et al. |
| 2009/0155990 A1* | 6/2009 | Yanagidaira et al. ......... 438/584 |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0273100 A1 | 11/2009 | Aton et al. |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0203689 A1 | 8/2010 | Bernstein et al. |
| 2010/0224943 A1 | 9/2010 | Kawasaki |
| 2010/0229140 A1 | 9/2010 | Strolenberg et al. |
| 2010/0232212 A1 | 9/2010 | Anderson et al. |
| 2010/0252865 A1 | 10/2010 | Van Der Zanden |
| 2010/0264468 A1 | 10/2010 | Xu |
| 2010/0270681 A1 | 10/2010 | Bird et al. |
| 2010/0287518 A1 | 11/2010 | Becker |
| 2011/0016909 A1 | 1/2011 | Mirza et al. |

(56) References Cited

U.S. PATENT DOCUMENTS

| | | |
|---|---|---|
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2012/0012932 A1 | 1/2012 | Perng et al. |
| 2012/0273841 A1 | 11/2012 | Quandt et al. |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |
| 2014/0197543 A1 | 7/2014 | Kornachuk et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 61-182244 | 8/1986 |
| JP | S63-310136 A | 12/1988 |
| JP | H01284115 | 11/1989 |
| JP | 03-165061 | 7/1991 |
| JP | H05211437 | 8/1993 |
| JP | H05218362 | 8/1993 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2001-168707 | 6/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-268610 | 9/2005 |
| JP | 2005-114752 | 10/2006 |
| JP | 2006-303022 A | 11/2006 |
| JP | 2007-013060 | 1/2007 |
| JP | 2007-043049 | 2/2007 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 10-2005-0030347 A | 3/2005 |
| KR | 2005-0037965 A | 4/2005 |
| KR | 2006-0108233 A | 10/2006 |
| TW | 386288 | 4/2000 |
| WO | WO 2005/104356 | 11/2005 |
| WO | WO 2006/014849 | 2/2006 |
| WO | WO 2006/052738 | 5/2006 |
| WO | WO 2007/014053 | 2/2007 |
| WO | WO 2007/103587 | 9/2007 |

OTHER PUBLICATIONS

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-Al and Insulator and its Application to Quarter Micron Gate Array LSIs", 1995, IEEE, Japan, pp. 473-476.

Axelrad et al. "Efficient Full-Chip Yield Analysis Methodology for OPC-Corrected VLSI Design", 2000, International Symposium on Quality Electronic Design (ISQED).

Balasinski et al. "Impact of Subwavelength CD Tolerance on Device Performance", 2002, SPIE.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Capodieci, L., et al., "Toward a Methodology for Manufacturability-Driven Design Rule Exploration," DAC 2004, Jun. 7-11, 2004, San Diego, CA.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Patterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

Clark et al. "Managing Standby and Active Mode Leakage Power in Deep Sub-Micron Design", Aug. 9-11, 2004, ACM.

Cobb et al. "Using OPC to Optimize for Image Slope and Improve Process Window", 2003, SPIE.

Devgan "Leakage Issues in IC Design: Part 3", 2003, CCAD.

DeVor, et al., "Statistical Quality Design and Control", 1992, Macmillan Publishing Company, pp. 264-267.

Dictionary.com, "channel," in Collins English Dictionary—Complete & Unabridged 10th Edition. Source location: HarperCollins Publishers. http://dictionary.reference.com/browse/channel. Available: http://dictionary.reference.com.

Dusa, et al. "Pitch Doubling Through Dual Patterning Lithography Challenges in Integration and Litho Budgets", 2007, SPIE Proceedings Series, vol. 6520, 65200G.

El-Gamal, "Fast, Cheap and Under Control: The Next Implementation Fabric", Jun. 2-6, 2003, ACM Press, pp. 354-355.

Firedberg, et al., "Modeling Within-Field Gate Length Spatial Variation for Process-Design Co-Optimization," 2005 Proc. of SPIE vol. 5756, pp. 178-188.

Frankel, "Quantum State Control Interference Lithography and Trim Double Patterning for 32-16nm Lithography", 2007, SPIE Proceeding Series, vol. 6520; 65202L.

Garg, et al. "Lithography Driven Layout Design", 2005, IEEE.

Grobman et al. "Reticle Enhancement Technology Trends: Resource and Manufacturability Implications for the Implementation of Physical Designs" Apr. 1-4, 2001, ACM.

Grobman et al. "Reticle Enhancement Technology: Implications and Challenges for Physical Design" Jun. 18-22, 2001, ACM.

Gupta et al. "Enhanced Resist and Etch CD Control by Design Perturbation", Oct. 4-7, 2006, Society of Photo-Optical Instrumentation Engineers.

Gupta et al. "A Practical Transistor-Level Dual Threshold Voltage Assignment Methodology", 2005, Sixth International Symposium on Quality Electronic Design (ISQED).

(56) References Cited

OTHER PUBLICATIONS

Gupta et al. "Detailed Placement for Improved Depth of Focus and CD Control", 2005, ACM.
Gupta et al. "Joining the Design and Mask Flows for Better and Cheaper Masks", Oct. 14-17, 2004, Society of Photo-Optical Instrumentation Engineers.
Gupta et al. "Manufacturing-Aware Physical Design", 2003, ACM.
Gupta et al. "Selective Gate-Length Biasing for Cost-Effective Runtime Leakage Control", Jun. 7-11, 2004, ACM.
Gupta et al. "Wafer Topography-Aware Optical Proximity Correction for Better DOF Margin and CD Control", Apr. 13-15, 2005, SPIE.
Gupta, Puneet, et al., "Manufacturing-aware Design Methodology for Assist Feature Correctness," 2005.
Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.
Hakko, et al., "Extension of the 2D-TCC Technique to Optimize Mask Pattern Layouts," 2008 Proc. of SPIE vol. 7028, 11 pages.
Halpin et al., "Detailed Placement with Net Length Constraints," Publication Year 2003, Proceedings of the 3rd IEEE International Workshop on System-on-Chip for Real-Time Applications, pp. 22-27.
Hayashida, et al., "Manufacturable Local Interconnect technology Fully Compatible with Titanium Salicide Process", Jun. 11-12, 1991, VMIC Conference.
Heng, et al., "A VLSI Artwork Legalization Technique Base on a New Criterion of Minimum Layout Perturbation", 1997, ACM Press, pp. 116-121.
Heng, et al., "Toward Through-Process Layout Quality Metrics", Mar. 3-4, 2005, Society of Photo-Optical Instrumentation Engineers.
Hu, et al., "Synthesis and Placement Flow for Gain-Based Programmable Regular Fabrics", Apr. 6-9, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170.
Hutton, et al., "A Methodology for FPGA to Structured-ASIC Synthesis and Verification", 2006, EDAA, pp. 64-69.
Intel Core Microarchitecture White Paper "Introducing the 45 nm Next-Generation Intel Core Microarchitecture," 2007, Intel Corporation.
Jayakumar, et al., "A Metal and VIA Maskset Programmable VLSI Design Methodology using PLAs", 2004, IEEE, pp. 590-594.
Jhaveri, T. et al., Maximization of Layout Printability/Manufacturability by Extreme Layout Regularity, Proc. of the SPIE, Apr. 2006.
Kang, S.M., Metal-Metal Matrix (M3) for High-Speed MOS VLSI Layout, IEEE Trans. on CAD, vol. CAD-6, No. 5, Sep. 1987.
Kawashima, et al., "Mask Optimization for Arbitrary Patterns with 2D-TCC Resolution Enhancement Technique," 2008 Proc. of SPIE vol. 6924, 12 pages.
Kheterpal, et al., "Design Methodology for IC Manufacturability Based on Regular Logic-Bricks", DAC, Jun. 13-17, 2005, IEEE/AMC, vol. 6520.
Kheterpal, et al., "Routing Architecture Exploration for Regular Fabrics", DAC, Jun. 7-11, 2004, ACM Press, pp. 204-207.
Kim, et al., "Double Exposure Using 193nm Negative Tone Photoresist", 2007, SPIE Proceeding Series, vol. 6520; 65202M.
Kim, et al., "Issues and Challenges of Double Patterning Lithography in DRAM", 2007, SPIE Proceeding Series, vol. 6520; 65200H.
Koorapaty, et al., "Exploring Logic Block Granularity for Regular Fabrics", 2004, IEEE, pp. 1-6.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.
Kuh et al., "Recent Advances in VLSI Layout," Publication Year 1990, Proceedings of the IEEE, vol. 78, Issue 2, pp. 237-263.
Lavin et al. "Backend DAC Flows for "Restrictive Design Rules"", 2004, IEEE.
Li, et al., "A Linear-Centric Modeling Approach to Harmonic Balance Analysis", 2002, IEEE, pp. 1-6.
Li, et al., "Nonlinear Distortion Analysis Via Linear-Centric Models", 2003, IEEE, pp. 897-903.
Liebmann et al., "Integrating DfM Components Into a Cohesive Design-To-Silicon Solution", IBM Systems and Technology Group, b IBM Research, pp. 1-12.
Liebmann et al., "Optimizing Style Options for Sub-Resolution Assist Features," Proc. of SPIE vol. 4346, 2001, pp. 141-152.
Liebmann, et al., "High-Performance Circuit Design for the RET-Enabled 65nm Technology Node", Feb. 26-27, 2004, SPIE Proceeding Series, vol. 5379 pp. 20-29.
Liebmann, L. W., Layout Impact of Resolution Enhancement Techniques: Impediment or Opportunity?, International Symposium on Physical Design, 2003.
Liu, et al., "Double Patterning with Multilayer Hard Mask Shrinkage for Sub-0.25 k1 Lithography", 200, SPIE Proceeding Series, vol. 6520; 65202J.
Mansfield et al., "Lithographic Comparison of Assist Feature Design Strategies," Proc. of SPIE vol. 4000, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, 2011.
Mo, et al., "Checkerboard: A Regular Structure and its Synthesis, International Workshop on Logic and Synthesis", 2003, Department of Electrical Engineering and Computer Sciences, UC Berkeley, California, pp. 1-7.
Mo, et al., "PLA-Based Regular Structures and Their Synthesis", 2003, Department of Electrical Engineering and Computer Sciences, IEEE, pp. 723-729.
Mo, et al., "Regular Fabrics in Deep Sub-Micron Integrated-Circuit Design", 2004, Kluwer Academic Publishers, Entire Book.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE.
Op de Beek, et al., "Manufacturability issues with Double Patterning for 50nm half pitch damascene applications, using RELACS® shrink and corresponding OPC", 2007, SPIE Proceeding Series, vol. 6520; 65200I.
Or-Bach, "Programmable Circuit Fabrics", Sep. 18, 2001, e-ASIC, pp. 1-36.
Otten, et al., "Planning for Performance", DAC 1998, ACM Inc., pp. 122-127.
Pack et al. "Physical & Timing Verification of Subwavelength-Scale Designs—Part I: Lithography Impact on MOSFETs", 2003, SPIE.
Pandini, et al., "Congestion-Aware Logic Synthesis", 2002, IEEE, pp. 1-8.
Pandini, et al., "Understanding and Addressing the Impact of Wiring Congestion During Technology Mapping", ISPD Apr. 7-10, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FINFET Device Junction Formation Challenges," 2006 International Workshop on Junction Technology, pp. 73-77, Aug. 2006.
Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.
Poonawala, et al., "ILT for Double Exposure Lithography with Conventional and Novel Materials", 2007, SPIE Proceeding Series, vol. 6520; 65202Q.
Qian et al. "Advanced Physical Models for Mask Data Verification and Impacts on Physical Layout Synthesis" 2003. IEEE.

(56) References Cited

OTHER PUBLICATIONS

Ran, et al., "An Integrated Design Flow for a Via-Configurable Gate Array", 2004, IEEE, pp. 582-589.

Ran, et al., "Designing a Via-Configurable Regular Fabric", Custom Integrated Circuits Conference (CICC). Proceedings of the IEEE, Oct. 2004, Oct. 1, 2004, pp. 423-426.

Ran, et al., "On Designing Via-Configurable Cell Blocks for Regular Fabrics" Proceedings of the Design Automation Conference (DAC) 2004, Jun. 2004, ACM Press, s 198-203.

Ran, et al., "The Magic of a Via-Configurable Regular Fabric", Proceedings of the IEEE International Conference on Computer Design (ICCD) Oct. 2004.

Ran, et al., "Via-Configurable Routing Architectures and Fast Design Mappability Estimation for Regular Fabrics", 2005, IEEE, pp. 25-32.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Rosenbluth, et al., "Optimum Mask and Source Patterns to Print a Given Shape," 2001 Proc. of SPIE vol. 4346, pp. 486-502.

Rovner, "Design for Manufacturability in Via Programmable Gate Arrays", May 2003, Graduate School of Carnegie Mellon University.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Shi et al., "Understanding the Forbidden Pitch and Assist Feature Placement," Proc. of SPIE vol. 4562, 2002, pp. 968-979.

Smayling et al., "APF Pitch Halving for 22 nm Logic Cells Using Gridded Design Rules," Proceedings of SPIE, USA, vol. 6925, Jan. 1, 2008, pp. 69251E-1-69251E-7.

Socha, et al., "Simultaneous Source Mask Optimization (SMO)," 2005 Proc. of SPIE vol. 5853, pp. 180-193.

Sreedhar et al. "Statistical Yield Modeling for Sub-Wavelength Lithography", 2008, IEEE.

Stapper, "Modeling of Defects in Integrated Circuit Photolithographic Patterns", Jul. 1, 1984, IBM, vol. 28 # 4, pp. 461-475.

Taylor, et al., "Enabling Energy Efficiency in Via-Patterned Gate Array Devices", Jun. 7-11, 2004, ACM Press, pp. 874-877.

Tian et al. "Model-Based Dummy Feature Placement for Oxide Chemical_Mechanical Polishing Manufacturability" 2000, ACM.

Tong, et al., "Regular Logic Fabrics for a Via Patterned Gate Array (VPGA), Custom Integrated Circuits Conference", Sep. 2003, Proceedings of the IEEE, pp. 53-56.

Vanleenhove, et al., "A Litho-Only Approach to Double Patterning", 2007, SPIE Proceeding Series, vol. 6520; 65202F.

Wang, et al., "Performance Optimization for Gridded-Layout Standard Cells", 2004, vol. 5567 SPIE.

Wang, J. et al., Standard Cell Layout with Regular Contact Placement, IEEE Trans. on Semicon. Mfg., vol. 17, No. 3, Aug. 2004.

Webb, Clair, "45nm Design for Manufacturing," Intel Technology Journal, vol. 12, Issue 02, Jun. 17, 2008, ISSN 1535-864X, pp. 121-130.

Webb, Clair, "Layout Rule Trends and Affect upon CPU Design", 2006, vol. 6156 SPIE.

Wenren, et al., "The Improvement of Photolithographic Fidelity of Two-dimensional Structures Though Double Exposure Method", 2007, SPIE Proceeding Series, vol. 6520; 65202I.

Wilcox, et al., "Design for Manufacturability: A Key to Semiconductor Manufacturing Excellence", 1998, IEEE, pp. 308-313.

Wong, et al., "Resolution Enhancement Techniques and Design for Manufacturability: Containing and Accounting for Variabilities in Integrated Circuit Creation," J. Micro/Nanolith. MEMS MOEMS, Jul.-Sep. 2007, vol. 6(3), 2 pages.

Wu, et al., "A Study of Process Window Capabilities for Two-dimensional Structures under Double Exposure Condition", 2007, SPIE Proceeding Series, vol. 6520; 65202O.

Xiong, et al., "The Constrained Via Minimization Problem for PCB and VLSI Design", 1988, ACM Press/IEEE, pp. 573-578.

Yamamaoto, et al., "New Double Exposure Technique without Alternating Phase Shift Mask", 2007, SPIE Proceeding Series, vol. 6520; 652052P.

Yamazoe, et al., "Resolution Enhancement by Aerial Image Approximation with 2D-TCC," 2007 Proc. of SPIE vol. 6730, 12 pages.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Yu, et al., "True Process Variation Aware Optical Proximity Correction with Variational Lithography Modeling and Model Calibration," J. Micro/Nanolith. MEMS MOEMS, Jul.-Sep. 2007, vol. 6(3), 16 pages.

Zheng, et al."Modeling and Analysis of Regular Symmetrically Structured Power/Ground Distribution Networks", DAC, Jun. 10-14, 2002, ACM Press, pp. 395-398.

Zhu, et al., "A Stochastic Integral Equation Method for Modeling the Rough Surface Effect on Interconnect Capacitance", 2004, IEEE.

Zhu, et al., "A Study of Double Exposure Process Design with Balanced Performance Parameters for Line/Space Applications", 2007, SPIE Proceeding Series, vol. 6520; 65202H.

Zuchowski, et al., "A Hybrid ASIC and FPGA Architecture", 2003, IEEE, pp. 187-194.

Alam, Syed M. et al., "A Comprehensive Layout Methodology and Layout-Specific Circuit Analyses for Three-Dimensional Integrated Circuits," Mar. 21, 2002.

Alam, Syed M. et al., "Layout-Specific Circuit Evaluation in 3-D Integrated Circuits," May 2003.

Aubusson, Russel, "Wafer-Scale Integration of Semiconductor Memory," Apr. 1979.

Bachtold, "Logic Circuits with Carbon," Nov. 9, 2001.

Baker, R. Jacob,"CMOS: Circuit Design, Layout, and Simulation (2nd Edition)," Nov. 1, 2004.

Baldi et al., "A Scalable Single Poly EEPROM Cell for Embedded Memory Applications," pp. 1-4, Fig. 1, Sep. 1997.

Cao, Ke, "DEsign for Manufacturing (DFM) in Submicron VLSI Design," Aug. 2007.

Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.

Chang, Leland et al., "Stable SRAM Cell Design for the 32 nm Node and Beyond," Jun. 16, 2005.

Cheung, Peter, "Layout Design," Apr. 4, 2004.

Chinnery, David, "Closing the Gap Between ASIC & Custom: Tools and Techniques for High-Performance ASIC Design," Jun. 30, 2002.

Chou, Dyiann et al., "Line End Optimization through Optical Proximity Correction (OPC): A Case Study," Feb. 19, 2006.

Clein, Dan, "CMOS IC Layout: Concepts, Methodologies, and Tools," Dec. 22, 1999.

Cowell, "Exploiting Non-Uniform Access Time," Jul. 2003.

Das, Sharmik, "Design Automation and Analysis of Three-Dimensional Integrated Circuits," May 1, 2004.

Dehaene, W. et al., "Technology-Aware Design of SRAM Memory Circuits," Mar. 2007.

Deng, Liang et al., "Coupling-aware Dummy Metal Insertion for Lithography," p. 1, col. 2, 2007.

Deviovre et al., "Validated 90nm CMOS Technology Platform with Low-k Copper Interconnects for Advanced System-on-Chip (SoC)," 2002.

Enbody, R. J., "Near-Optimal n-Layer Channel Routing," 1986.

Ferretti, Marcos et al., "High Performance Asynchronous ASIC Back-End Design Flow Using Single-Track Full-Buffer Standard Cells," Apr. 23, 2004.

Garg, Manish et al., "Litho-driven Layouts for Reducing Performance Variability," p. 2, Figs. 2b-2c, May 23, 2005.

(56) References Cited

OTHER PUBLICATIONS

Greenway, Robert et al., "32nm 1-D Regular Pitch SRAM Bitcell Design for Interference-Assisted Lithography," 2008.
Gupta et al., "Modeling Edge Placement Error Distribution in Standard Cell Library," Feb. 23-24, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRATL—Intellectual Property Reuse-based Analog IC Layout Automation," Mar. 17, 2003.
Hastings, Alan, "The Art of Analog Layout (2nd Edition)," Jul. 4, 2005.
Hurata et al., "A Genuine Design Manufacturability Check for Designers," 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, 2003.
Liebmann, Lars et al., "TCAD development for lithography resolution enhancement," Sep. 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, 2006.
MOSIS, "Design Rules MOSIS Scalable CMOS (SCMOS) (Revision 8.00)," Oct. 4, 2004.
MOSIS, "MOSIS Scalable CMOS (SCMOS) Design Rules (Revision 7.2)."
Muta et al., "Manufacturability-Aware Design of Standard Cells," pp. 2686-2690, Figs. 3, 12, Dec. 2007.
Na, Kee-Yeol et al., "A Novel Single Polysilicon EEPROM Cell With a Polyfinger Capacitor," Nov. 30, 2007.
Pan et al., "Redundant Via Enahnced Maze Routing for Yield Improvement," 2005.
Park, Tae Hong, "Characterization and Modeling of Pattern Dependencies in Copper Interconnects for Integrated Circuits," Ph.D. Thesis, MIT, 2002.
Patel, Chetan, "An Architectural Exploration of Via Patterned Gate Arrays (CMU Master's Project)," May 2003.
Pease, R. Fabian et al., "Lithography and Other Patterning Techniques for Future Electronics," 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006.
Pramanik, "Impact of layout on variability of devices for sub 90nm technologies," 2004.
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS Moems, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Unifoiniity in a Shallow Trench Isolation Process," IEEE Trans. on Computer-Aided Design of Integrated Circuits and Systems, vol. 21, No. 1, pp. 63-71, Jan. 2002.
Tian, Ruiqi et al., "Proximity Dummy Feature Placement and Selective Via Sizing for Process Uniformity in a Trench-First-Via-Last Dual-Inlaid Metal Process," Proc. Of IITC, pp. 48-50, 2001.
Torres, J. A. et al., "RET Compliant Cell Generation for sub-130nm Processes," 2002.
Uyemura, John P., "Introduction to VLSI Circuits and Systems," Chapters 2, 3, 5, and Part 3, 2002.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," 2006.
Wang, Dunwei et al., "Complementary Symmetry Silicon Nanowire Logic: Power-Efficient Inverters with Gain," 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE, vol. 5379)," 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions and Their Impact on Design," 2003.
Xu, Gang, "Redundant-Via Enhanced Maze Routing for Yield Improvement," 2005.
Yang, Jie, "Manufacturability Aware Design," pp. 93, 102, Fig. 5.2, 2007.
Yongshun, Wang et al., "Static Induction Devices with Planar Type Buried Gate," 2004.
Zobrist, George (editor), "Progress in Computer Aided VLSI Design: Implementations (Ch. 5)," 1990.

(56) References Cited

OTHER PUBLICATIONS

Acar, et al., "A Linear-Centric Simulation Framework for Parametric Fluctuations", 2002, IEEE, Carnegie Mellon University USA, pp. 1-8, Jan. 28, 2002.
Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476, Dec. 10, 1995.
Axelrad et al. "Efficient Full-Chip Yield Analysis Methodology for OPC-Corrected VLSI Design", 2000, International Symposium on Quality Electronic Design (ISQED), Mar. 20, 2000.
Balasinski et al. "Impact of Subwavelength CD Tolerance on Device Performance", 2002, SPIE vol. 4692, Jul. 11, 2002.
Burkhardt, et al., "Dark Field Double Dipole Lithography (DDL) for Back-End-Of-Line Processes", 2007, SPIE Proceeding Series, vol. 6520; Mar. 26, 2007.
Capetti, et al., "Sub k1=0.25 Lithography with Double Patterning Technique for 45nm Technology Node Flash Memory Devices at λ=193nm", 2007, SPIE Proceeding Series, vol. 6520; Mar. 27, 2007.
Capodieci, L., et al., "Toward a Methodology for Manufacturability-Driven Design Rule Exploration," DAC 2004, Jun. 7, 2004, San Diego, CA.
Chandra, et al., "An Interconnect Channel Design Methodology for High Performance Integrated Circuits", 2004, IEEE, Carnegie Mellon University, pp. 1-6, Feb. 16, 2004.
Cheng, et al., "Feasibility Study of Splitting Pitch Technology on 45nm Contact Patterning with 0.93 NA", 2007, SPIE Proceeding Series, vol. 6520; Feb. 25, 2007.
Chow, et al., "The Design of a SRAM-Based Field-Programmable Gate Array—Part II: Circuit Design and Layout", 1999, IEEE, vol. 7 # 3 pp. 321-330, Sep. 1, 1999.
Clark et al. "Managing Standby and Active Mode Leakage Power in Deep Sub-Micron Design", Aug. 9, 2004, ACM.
Cobb et al. "Using OPC to Optimize for Image Slope and Improve Process Window", 2003, SPIE vol. 5130, Apr. 16, 2003.
Devgan "Leakage Issues in IC Design: Part 3", 2003, ICCAD, Nov. 9, 2003.
DeVor, et al., "Statistical Quality Design and Control", 1992, Macmillan Publishing Company, pp. 264-267, Jan. 3, 1992.
Dictionary.com, "channel," in Collins English Dictionary—Complete & Unabridged 10th Edition. Source location: HarperCollins Publishers. Sep. 3, 2009.
Dusa, et al. "Pitch Doubling Through Dual Patterning Lithography Challenges in Integration and Litho Budgets", 2007, SPIE Proceeding Series, vol. 6520; Feb. 25, 2007.
El-Gamal, "Fast, Cheap and Under Control: The Next Implementation Fabric", Jun. 2, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188, Feb. 27, 2005.
Frankel, "Quantum State Control Interference Lithography and Trim Double Patterning for 32-16nm Lithography", 2007, SPIE Proceeding Series, vol. 6520; Feb. 27, 2007.
Garg, et al. "Lithography Driven Layout Design", 2005, IEEE VLSI Design 2005, Jan. 3, 2005.
Grobman et al. "Reticle Enhancement Technology Trends: Resource and Manufacturability Implications for the Implementation of Physical Designs" Apr. 1, 2001, ACM.
Grobman et al. "Reticle Enhancement Technology. Implications and Challenges for Physical Design" Jun. 8, 2001, ACM.
Gupta et al. "Enhanced Resist and Etch CD Control by Design Perturbation", Oct. 4, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED), Mar. 21, 2005.
Gupta et al. "Detailed Placement for Improved Depth of Focus and CD Control", 2005, ACM, Jan. 18, 2005.

Gupta et al. "Joining the Design and Mask Flows for Better and Cheaper Masks", Oct. 14, 2004, Society of Photo-Optical Instrumentation Engineers.
Gupta et al. "Manufacturing-Aware Physical Design", ICCAD 2003, Nov. 9, 2003.
Gupta et al. "Selective Gate-Length Biasing for Cost-Effective Runtime Leakage Control", Jun. 7, 2004, ACM.
Gupta et al. "Wafer Topography-Aware Optical Proximity Correction for Better DOF Margin and CD Control", Apr. 13, 2005, SPIE.
Gupta, Puneet, et al., "Manufacturing-aware Design Methodology for Assist Feature Correctness," SPIE vol. 5756, May 13, 2005.
Ha et al., "Reduction in the Mask Error Factor by Optimizing the Diffraction Order of a Scattering Bar in Lithography," Journal of the Korean Physical Society, vol. 46, No. 5, May 5, 2005, pp. 1213-1217.
Hakko, et al., "Extension of the 2D-TCC Technique to Optimize Mask Pattern Layouts," 2008 Proc. of SPIE vol. 7028, 11 pages, Apr. 16, 2008.
Halpin et al., "Detailed Placement with Net Length Constraints," Publication Year 2003, Proceedings of the 3rd IEEE International Workshop on System-on-Chip for Real-Time Applications, pp. 22-27, Jun. 30, 2003.
Hayashida, et al., "Manufacturable Local Interconnect technology Fully Compatible with Titanium Salicide Process", Jun. 11, 1991, VMIC Conference.
Heng, et al., "A VLSI Artwork Legalization Technique Base on a New Criterion of Minimum Layout Perturbation", Proceedings of 1997 International Symposium on Physical Design, pp. 116-121, Apr. 14, 1997.
Heng, et al., "Toward Through-Process Layout Quality Metrics", Mar. 3, 2005, Society of Photo-Optical Instrumentation Engineers.
Hu, et al., "Synthesis and Placement Flow for Gain-Based Programmable Regular Fabrics", Apr. 6, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170, Nov. 5, 2000.
Hutton, et al., "A Methodology for FPGA to Structured-ASIC Synthesis and Verification", 2006, EDAA, pp. 64-69, Mar. 6, 2006.
Intel Core Microarchitecture White Paper "Introducing the 45 nm Next-Generation Intel Core Microarchitecture," Intel Corporation, 2007 (best available publication date).
Jayakumar, et al., "A Metal and VIA Maskset Programmable VLSI Design Methodology using PLAs", 2004, IEEE, pp. 590-594, Nov. 7, 2004.
Jhaveri, T. et al., Maximization of Layout Printability/Manufacturability by Extreme Layout Regularity, Proc. of the SPIE vol. 6156, Feb. 19, 2006.
Kang, S.M., Metal-Metal Matrix (M3) for High-Speed MOS VLSI Layout, IEEE Trans. on CAD, vol. CAD-6, No. 5, Sep. 1, 1987.
Kawashima, et al., "Mask Optimization for Arbitrary Patterns with 2D-TCC Resolution Enhancement Technique," 2008 Proc. of SPIE vol. 6924, 12 pages, Feb. 24, 2008.
Kheterpal, et al., "Design Methodology for IC Manufacturability Based on Regular Logic-Bricks", DAC, Jun. 13, 2005, IEEE/AMC, vol. 6520.
Kheterpal, et al., "Routing Architecture Exploration for Regular Fabrics", DAC, Jun. 7, 2004, ACM Press, pp. 204-207.
Kim, et al., "Double Exposure Using 193nm Negative Tone Photoresist", 2007, SPIE Proceeding Series, vol. 6520; Feb. 25, 2007.
Kim, et al., "Issues and Challenges of Double Patterning Lithography in DRAM", 2007, SPIE Proceeding Series, vol. 6520; Feb. 25, 2007.
Koorapaty, et al., "Exploring Logic Block Granularity for Regular Fabrics", 2004, IEEE, pp. 1-6, Feb. 16, 2004.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 1, 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2, 2002, Springer-Verlag, vol. 2438 pp. 132-141.

(56) References Cited

OTHER PUBLICATIONS

Kuh et al., "Recent Advances in VLSI Layout," Proceedings of the IEEE, vol. 78, Issue 2, pp. 237-263, Feb. 1, 1990.
Lavin et al. "Backend DAC Flows for "Restrictive Design Rules"", 2004, IEEE, Nov. 7, 2004.
Li, et al., "A Linear-Centric Modeling Approach to Harmonic Balance Analysis", 2002, IEEE, pp. 1-6, Mar. 4, 2002.
Li, et al., "Nonlinear Distortion Analysis Via Linear-Centric Models", 2003, IEEE, pp. 897-903, Jan. 21, 2003.
Liebmann et al., "Integrating DfM Components into a Cohesive Design-to-Silicon Solution," Proc. SPIE 5756, Design and Process Integration for Microelectronic Manufacturing III, Feb. 27, 2005.
Liebmann et al., "Optimizing Style Options for Sub-Resolution Assist Features," Proc. of SPIE vol. 4346, Feb. 25, 2001, pp. 141-152.
Liebmann, et al., "High-Performance Circuit Design for the RET-Enabled 65nm Technology Node", Feb. 26, 2004, SPIE Proceeding Series, vol. 5379 pp. 20-29.
Liebmann, L. W., Layout Impact of Resolution Enhancement Techniques: Impediment or Opportunity?, International Symposium on Physical Design, Apr. 6, 2003.
Liu et al., "Double Patterning with Multilayer Hard Mask Shrinkage for Sub 0.25 k1 Lithography," Proc. SPIE 6520, Optical Microlithography XX, Feb. 25, 2007.
Mansfield et al., "Lithographic Comparison of Assist Feature Design Strategies," Proc. of SPIE vol. 4000, Feb. 27, 2000, pp. 63-76.
Mishra, P., et al., "FinFET Circuit Design," Nanoelectronic Circuit Design, pp. 23-54, Dec. 21, 2010.
Mo, et al., "Checkerboard: A Regular Structure and its Synthesis, International Workshop on Logic and Synthesis", Department of Electrical Engineering and Computer Sciences, UC Berkeley, California, pp. 1-7, Jun. 1, 2003.
Mo, et al., "PLA-Based Regular Structures and Their Synthesis", Department of Electrical Engineering and Computer Sciences, IEEE, pp. 723-729, Jun. 1, 2003.
Mo, et al., "Regular Fabrics in Deep Sub-Micron Integrated-Circuit Design", Kluwer Academic Publishers, Entire Book, Jun. 1, 2002.
Mutoh et al. "1-V Power Supply High-Speed Digital Circuit Technology with Multithreshold-Voltage CMOS", 1995, IEEE, Aug. 1, 1995.
Op de Beek, et al., "Manufacturability issues with Double Patterning for 50nm half pitch damascene applications, using RELACS® shrink and corresponding OPC", 2007, SPIE Proceeding Series, vol. 6520; Feb. 25, 2007.
Otten, et al., "Planning for Performance", DAC 1998, ACM Inc., pp. 122-127, Jun. 15, 1998.
Pack et al. "Physical & Timing Verification of Subwavelength-Scale Designs—Part I: Lithography Impact on MOSFETs", 2003, SPIE vol. 5042, Feb. 23, 2003.
Pandini, et al., "Congestion-Aware Logic Synthesis", 2002, IEEE, pp. 1-8, Mar. 4, 2002.
Pandini, et al., "Understanding and Addressing the Impact of Wiring Congestion During Technology Mapping", ISPD Apr. 7, 2002, ACM Press, pp. 131-136.
Pham, D., et al., "FINFET Device Junction Formation Challenges," 2006 International Workshop on Junction Technology, pp. 73-77, Aug. 1, 2006.
Pileggi, et al., "Exploring Regular Fabrics to Optimize the Performance-Cost Trade-Offs, Proceedings of the 40th ACM/IEEE Design Automation Conference (DAC) 2003", Jun. 2, 2003, ACM Press, pp. 782-787.
Poonawala, et al., "ILT for Double Exposure Lithography with Conventional and Novel Materials", 2007, SPIE Proceeding Series, vol. 6520; Feb. 25, 2007.
Qian et al. "Advanced Physical Models for Mask Data Verification and Impacts on Physical Layout Synthesis" 2003 IEEE, Mar. 24, 2003.
Ran, et al., "An Integrated Design Flow for a Via-Configurable Gate Array", 2004, IEEE, pp. 582-589, Nov. 7, 2004.
Ran, et al., "Designing a Via-Configurable Regular Fabric", Custom Integrated Circuits Conference (CICC). Proceedings of the IEEE, Oct. 1, 2004, pp. 423-426.
Ran, et al., "On Designing Via-Configurable Cell Blocks for Regular Fabrics" Proceedings of the Design Automation Conference (DAC) 2004, Jun. 7, 2004, ACM Press, s 198-203.
Ran, et al., "The Magic of a Via-Configurable Regular Fabric", Proceedings of the IEEE International Conference on Computer Design (ICCD) Oct. 11, 2004.
Ran, et al., "Via-Configurable Routing Architectures and Fast Design Mappability Estimation for Regular Fabrics", 2005, IEEE, pp. 25-32, Sep. 1, 2006.
Reis, et al., "Physical Design Methodologies for Performance Predictability and Manufacturability", Apr. 14, 2004, ACM Press, pp. 390-397.
Robertson, et al., "The Modeling of Double Patterning Lithographic Processes", 2007, SPIE Proceeding Series, vol. 6520; Feb. 25, 2007.
Rosenbluth, et al., "Optimum Mask and Source Patterns to Print a Given Shape," 2001 Proc. of SPIE vol. 4346, pp. 486-502, Feb. 25, 2001.
Rovner, "Design for Manufacturability in Via Programmable Gate Arrays", May 1, 2003, Graduate School of Carnegie Mellon University.
Sengupta, "An Integrated CAD Framework Linking VLSI Layout Editors and Process Simulators", 1998, Thesis for Rice University, pp. 1-101, Nov. 1, 1998.
Sengupta, et al., "An Integrated CAD Framework Linking VLSI Layout Editors and Process Simulators", 1996, SPIE Proceeding Series, vol. 2726; pp. 244-252, Mar. 10, 1996.
Sherlekar, "Design Considerations for Regular Fabrics", Apr. 18, 2004, ACM Press, pp. 97-102.
Shi et al., "Understanding the Forbidden Pitch and Assist Feature Placement," Proc. of SPIE vol. 4562, pp. 968-979, Mar. 11, 2002.
Socha, et al., "Simultaneous Source Mask Optimization (SMO)," 2005 Proc. of SPIE vol. 5853, pp. 180-193, Apr. 13, 2005.
Sreedhar et al. "Statistical Yield Modeling for Sub-Wavelength Lithography", 2008 IEEE, Oct. 28, 2008.
Taylor, et al., "Enabling Energy Efficiency in Via-Patterned Gate Array Devices", Jun. 7, 2004, ACM Press, pp. 874-877.
Tian et al. "Model-Based Dummy Feature Placement for Oxide Chemical_Mechanical Polishing Manufacturability" IEEE, vol. 20, Issue 7, Jul. 1, 2001.
Tong, et al., "Regular Logic Fabrics for a Via Patterned Gate Array (VPGA), Custom Integrated Circuits Conference", Sep. 21, 2003, Proceedings of the IEEE, pp. 53-56.
Vanleenhove, et al., "A Litho-Only Approach to Double Patterning", 2007, SPIE Proceeding Series, vol. 6520; Feb. 25, 2007.
Wang, et al., "Performance Optimization for Gridded-Layout Standard Cells", vol. 5567 SPIE, Sep. 13, 2004.
Wang, J. et al., Standard Cell Layout with Regular Contact Placement, IEEE Trans. on Semicon. Mfg., vol. 17, No. 3, Aug. 9, 2004.
Webb, Clair, "Layout Rule Trends and Affect upon CPU Design", vol. 6156 SPIE, Feb. 19, 2006.
Wenren, et al., "The Improvement of Photolithographic Fidelity of Two-dimensional Structures Though Double Exposure Method", 2007, SPIE Proceeding Series, vol. 6520; Feb. 25, 2007.
Wilcox, et al., "Design for Manufacturability: A Key to Semiconductor Manufacturing Excellence", 1998 IEEE, pp. 308-313, Sep. 23, 1998.
Wong, et al., "Resolution Enhancement Techniques and Design for Manufacturability: Containing and Accounting for Variabilities in Integrated Circuit Creation," J. Micro/Nanolith. MEMS MOEMS, Sep. 27, 2007, vol. 6(3), 2 pages.
Wu, et al., "A Study of Process Window Capabilities for Two-dimensional Structures under Double Exposure Condition", 2007, SPIE Proceeding Series, vol. 6520; Feb. 25, 2007.
Xiong, et al., "The Constrained Via Minimization Problem for PCB and VLSI Design", 1988 ACM Press/IEEE, pp. 573-578, Jun. 12, 1998.
Yamamaoto, et al., "New Double Exposure Technique without Alternating Phase Shift Mask", SPIE Proceeding Series, vol. 6520; Feb. 25, 2007.

(56) References Cited

OTHER PUBLICATIONS

Yamazoe, et al., "Resolution Enhancement by Aerial Image Approximation with 2D-TCC," 2007 Proc. of SPIE vol. 6730, 12 pages, Sep. 17, 2007.
Yang, et al., "Interconnection Driven VLSI Module Placement Based on Quadratic Programming and Considering Congestion Using LFF Principles", 2004 IEEE, pp. 1243-1247, Jun. 27, 2004.
Yao, et al., "Multilevel Routing With Redundant Via Insertion", Oct. 23, 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Sep. 11, 2007, vol. 6(3), 16 pages.
Zheng, et al."Modeling and Analysis of Regular Symmetrically Structured Power/Ground Distribution Networks", DAC, Jun. 10, 2002, ACM Press, pp. 395-398.
Zhu, et al., "A Stochastic Integral Equation Method for Modeling the Rough Surface Effect on Interconnect Capacitance", 2004 IEEE, Nov. 7, 2004.
Zhu, et al., "A Study of Double Exposure Process Design with Balanced Performance Parameters for Line/Space Applications", 2007, SPIE Proceeding Series, vol. 6520; Feb. 25, 2007.
Zuchowski, et al., "A Hybrid ASIC and FPGA Architecture", 2003 IEEE, pp. 187-194, Nov. 10, 2002.
Alam, Syed M. et al., "Layout-Specific Circuit Evaluation in 3-D Integrated Circuits," May 1, 2003.
Aubusson, Russel, "Wafer-Scale Integration of Semiconductor Memory," Apr. 1, 1979.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1, 1997.
Cao, Ke, "Design for Manufacturing (DFM) in Submicron VLSI Design," Aug. 1, 2007.
Cowell, "Exploiting Non-Uniform Access Time," Jul. 1, 2003.
Das, Shamik, "Design Automation and Analysis of Three-Dimensional Integrated Circuits," May 1, 2004.
Dehaene, W. et al., "Technology-Aware Design of SRAM Memory Circuits," Mar. 1, 2007.
Deng, Liang et al., "Coupling-aware Dummy Metal Insertion for Lithography," p. 1, col. 2, Jan. 23, 2007.
Devoivre et al., "Validated 90nm CMOS Technology Platform with Low-k Copper Interconnects for Advanced System-on-Chip (SoC)," Jul. 12, 2002.
Enbody, R. J., "Near-Optimal n-Layer Channel Routing," Jun. 29, 1986.
Greenway, Robert et al., "32nm 1-D Regular Pitch SRAM Bitcell Design for Interference-Assisted Lithography," Oct. 6, 2008.
Gupta et al., "Modeling Edge Placement Error Distribution in Standard Cell Library," Feb. 23, 2006.
Hartono, Roy et al., "IPRAIL—Intellectual Property Reuse-based Analog IC Layout Automation," Mar. 17, 2003.
Hurat et al., "A Genuine Design Manufacturability Check for Designers," Feb. 19, 2006.
Ishida, M. et al., "A Novel 6T-SRAM Cell Technology Designed with Rectangular Patterns Scalable beyond 0.18 pm Generation and Desirable for Ultra High Speed Operation," IEDM 1998, Dec. 6, 1998.
Kahng, Andrew B., "Design Optimizations DAC-2006 DFM Tutorial, part V)," Jul. 24, 2006.
Kurokawa, Atsushi et al., "Dummy Filling Methods for Reducing Interconnect Capacitance and Number of Fills, Proc. of ISQED," pp. 586-591, Mar. 21, 2005.
Liebmann, Lars et al., "Layout Methodology Impact of Resolution Enhancement Techniques," pp. 5-6, Apr. 6, 2003.
Liebmann, Lars et al., "TCAD development for lithography resolution enhancement," Sep. 1, 2001.
McCullen, Kevin W., "Layout Techniques for Phase Correct and Gridded Wiring," pp. 13, 17, Fig. 5, Dec. 1, 2006.
Mosis, "MOSIS Scalable CMOS (SCMOS) Design Rules (Revision 7.2)," Jan. 1, 1995.
Muta et al., "Manufacturability-Aware Design of Standard Cells," pp. 2686-2690, Figs. 3, 12, Dec. 1, 2007.
Pan et al., "Redundant Via Enhanced Maze Routing for Yield Improvement," DAC 2005, Jan. 18, 2005.
Park, Tae Hong, "Characterization and Modeling of Pattern Dependencies in Copper Interconnects for Integrated Circuits," Ph.D. Thesis, MIT, May 24, 2002.
Patel, Chetan, "An Architectural Exploration of Via Patterned Gate Arrays (CMU Master's Project)," May 1, 2003.
Pease, R. Fabian et al., "Lithography and Other Patterning Techniques for Future Electronics," IEEE 2008, vol. 96, Issue 2, Jan. 16, 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006 (best available publication date).
Pramanik, "Impact of layout on variability of devices for sub 90nm technologies," 2004 (best available publication date).
Saint, Christopher et al., "IC Mask Design: Essential Layout Techniques," May 24, 2002.
Smayling, Michael C., "Part 3: Test Structures, Test Chips, In-Line Metrology & Inspection," Jul. 24, 2006.
Tang, C. W. et al., "A compact large signal model of LDMOS," Solid-State Electronics 46(2002) 2111-2115, May 17, 2002.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 1, 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, Jun. 6, 2001.
Torres, J. A. et al., "RET Compliant Cell Generation for sub-130nm Processes," SPIE vol. 4692, Mar. 6, 2002.
Uyemura, John P., "Introduction to VLSI Circuits and Systems," Chapters 2, 3, 5, and Part 3, Jul. 30, 2001.
Wong, Ban P., "Bridging the Gap between Dreams and Nano-Scale Reality (DAC-2006 DFM Tutorial)," Jul. 28, 2006.
Wang, Dunwei et al., "Complementary Symmetry Silicon Nanowire Logic: Power-Efficient Inverters with Gain," Aug. 17, 2006.
Wang, Jun et al., "Standard cell design with regularly placed contacts and gates (SPIE vol. 5379)," Feb. 22, 2004.
Watson, Bruce, "Challenges and Automata Applications in Chip-Design Software," pp. 38-40, Jul. 16, 2007.
Wong, Alfred K., "Microlithography: Trends, Challenges, Solutions and Their Impact on Design," Micro IEEE vol. 23, Issue 2, Apr. 29, 2003.
Xu, Gang, "Redundant-Via Enhanced Maze Routing for Yield Improvement," Proceedings of ASP-DAC 2005, Jan. 18, 2005.
Yang, Jie, "Manufacturability Aware Design," pp. 93, 102, Fig. 5.2, Jan. 16, 2008.
Yongshun, Wang et al., "Static Induction Devices with Planar Type Buried Gate," Chinese Journal of Semiconductors, vol. 25, No. 2, Feb. 1, 2004.
Zobrist, George (editor), "Progress in Computer Aided VLSI Design: Implementations (Ch. 5)," Ablex Publishing Corporation, Feb. 1, 1990.
Petley, Graham, "VLSI and ASIC Technology Standard Cell Library Design," from website www.vlsitechnology.org, Jan. 11, 2005.
Liebmann, Lars, et al., "Layout Optimization at the Pinnacle of Optical Lithography," Design and Process Integration for Microelectronic Manufacturing II, Proceedings of SPIE vol. 5042, Jul. 8, 2003.

* cited by examiner

METHODS FOR LINEWIDTH MODIFICATION AND APPARATUS IMPLEMENTING THE SAME

CLAIM OF PRIORITY

This application claims priority under 35 U.S.C. 119(e) to U.S. Provisional Patent Application No. 61/413,284, filed Nov. 12, 2010, entitled "Methods for Linewidth Modification and Apparatus Implementing the Same," the disclosure of which is incorporated herein by reference in its entirety. Per 35 U.S.C. 119(e)(3), because the day that is 12 months after the filing date of U.S. Provisional Patent Application No. 61/413,284, falls on a Saturday, the period of pendency of U.S. Provisional Patent Application No. 61/413,284, is extended to the next succeeding business day of Monday, Nov. 14, 2011.

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are being reduced below 45 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, solutions are sought for improvements in integrated circuit design, layout, and fabrication that can improve management of lithographic gap issues as technology continues to progress toward smaller semiconductor device feature sizes.

SUMMARY

In one embodiment, a method is disclosed for fabricating a mask for etching of linear-shaped structures for an integrated circuit. The method includes forming a plurality of linear-shaped core structures of a first material on an underlying material. The method also includes conformally depositing a layer of a second material over each of the linear-shaped core structures and exposed portions of the underlying material. The method also includes etching the layer of the second material so as to leave a filament of the second material on each sidewall of each of the linear-shaped core structures, and so as to remove the second material from the underlying material. The method also includes depositing a third material over each filament of the second material. The method also includes removing a portion of the third material to as to expose one or more of the filaments of the second material. The method also includes etching the exposed filaments of the second material so as to leave thinner filaments of the second material. The method also includes removing the third material and the plurality of linear-shaped core structures of the first material so as to leave the filaments of the second material on the underlying material, whereby the filaments of the second material provides a mask for etching the underlying material.

In one embodiment, a method is disclosed for fabricating linear-shaped conductive structures for an integrated circuit. The method includes depositing a layer of a conductive material over a substrate. The method also includes forming a plurality of linear-shaped core structures of a first material on the conductive material. The method also includes conformally depositing a layer of a second material over each of the linear-shaped core structures and exposed portions of the conductive material. The method also includes etching the layer of the second material so as to leave a filament of the second material on each sidewall of each of the linear-shaped core structures and so as to remove the second material from the conductive material. The method also includes depositing a third material over each filament of the second material. The method also includes removing a portion of the third material to as to expose one or more of the filaments of the second material. The method also includes etching the exposed filaments of the second material so as to leave thinner filaments of the second material. The method also includes removing the third material and the plurality of linear-shaped core structures of the first material so as to leave the filaments of the second material on the conductive material, whereby the filaments of the second material provide a mask for etching the conductive material. The method also includes etching the conductive material so as to leave linear-shaped portions of the conductive material beneath the filaments of the second material. The method also includes removing the filaments of the second material from the linear-shaped portions of the conductive material.

Other aspects and advantages of the invention will become more apparent from the following detailed description, taken in conjunction with the accompanying drawings, illustrating by way of example the present invention.

DETAILED DESCRIPTION

Figure 1:
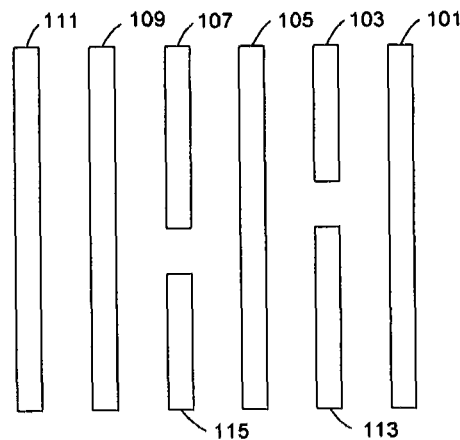
FIG. 1 shows a plan view of the gate electrode layer of an example logic circuit with uniform conductive segment line-widths, in accordance with an example embodiment.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Integrated circuit scaling has been enabled to a large extent by improvements in photolithography equipment resolution and overlay. The resolution capability was such that random logical functions could be drawn with two-dimensional (2D) bent layout shapes with few restrictions on layout shape dimensions or relationships between layout shapes. Some parts of certain types of integrated circuits (IC's), for example memory cells in a DRAM or Flash memory, were drawn with more regular layout patterns to permit reducing the feature sizes and hence the memory bit size.

As optical lithography has reached a cost-driven limit of the 193 nm ArF excimer laser light source and a lens numerical aperture of 0.93 (or 1.35 for water immersion systems), other approaches are being considered. One such approach is double patterning, in which the layout pattern is split into two parts, each of which can be separately processed with optical lithography equipment.

One approach to double patterning for regular layout patterns is SDP (spacer double patterning). This approach uses the following sequence to reduce the layout pattern shape-to-shape pitch by a factor of two:

1. standard optical lithography to pattern a "core"
2. etch the core and remove the resist
3. deposit a different material which can be etched selectively relative to the core
4. etch the deposited film, leaving sidewall material and the core
5. etch the core, leaving only the sidewall material
6. cut the sidewall material to create separate parts
7. etch the underlying material using the sidewall material as the mask
8. remove the sidewall material, leaving the underlying material with the desired pattern.

One attribute of this approach is that all of the sidewall filaments are uniform in line-width. This is desirable for the gate electrode layer, since uniform MOS transistor lengths give uniform circuit speed and leakage.

However, there are cases in which different gate electrode line-widths are useful, such as in analog circuits, in SRAM bit cells, in IO (input/output) cells, and for power optimization using several gate electrode critical dimensions (CD's) or line-widths, by way of example. Therefore, it can be necessary to design circuits that have different gate line-widths and/or MOS transistor structures with different line-widths. Accordingly, methods are needed to design and manufacture these types of circuits. Embodiments of such methods are disclosed herein.

Although the exemplary descriptions herein are provided within the context of the gate electrode layer, the approaches and principles illustrated herein can be applied to any masking layer/device layer in which SDP is done. Also, in some cases, multiple applications of SDP can be performed to obtain a pitch division by 4 or more. The "core" as depicted in the figures herein can either be a directly patterned core, or a line coming from a first SDP sequence which is now used as the "core" for a second SDP sequence. The linewidth modifications could be applied either after the first sequence, the second sequence, or both.

Gate linewidth modification is an effective method to control MOS transistor "off" or "leakage" current since. At technology nodes roughly below 28 nm (nanometers), the gate electrode is not patterned directly from a mask pattern. Instead, because of photolithography limits on pitch and the need for reduced LER (line-edge-roughness), the fabrication is done with the SDP process sequence. A "mold" or "core" is patterned and etched, then a filament is created around the edge. The width of the filament is uniform, and becomes the linewidth of the gate electrode. Hence, the gate linewidths are the same within the tolerance of the filament process.

A chip design is proposed which uses multiple gate electrode line-widths. The line-width is chosen based on requirements such as:

1. Relative current at a given gate bias for analog circuits
2. Ratio of current for select and pull-down transistors in an SRAM bit cell
3. Field-dependent breakdown voltage for IO transistors
4. Power optimized timing path, in which some transistors have gate lengths adjusted to reduce speed and leakage current or to increase speed and leakage current Structures on the chip are proposed with different gate electrode line-widths. These structures can be applied to functions such as:

1. Analog circuits
2. SRAM bit cells
3. IO cells
4. Logic cells selected for power/speed optimization Example methods to create the structures on the chip include:
1. Individually patterned lines with different widths
2. SDP pitch division flow to create lines, followed by circuit customization with cuts
   a. SDP to create uniform lines
   b. SDP with different sidewall filaments created with optical resolution or sub-optical resolution (e.g., e-beam)
   c. SDP with multiple film depositions and patterned etches to achieve different line-widths (combinations of etch selectivity are required, but the CD is well controlled by the film thicknesses)
   d. SDP with patterned etches, each etch creating a different line-width through etch time or etch rate or both FIG. 1 shows a plan view of the gate electrode layer of an example logic circuit with uniform conductive segment line-widths, in accordance with an example embodiment. The conductive segments of uniform line-width are represented by shapes 101, 103, 105, 107, 109, 111, 113, and 115.

Figure 2:
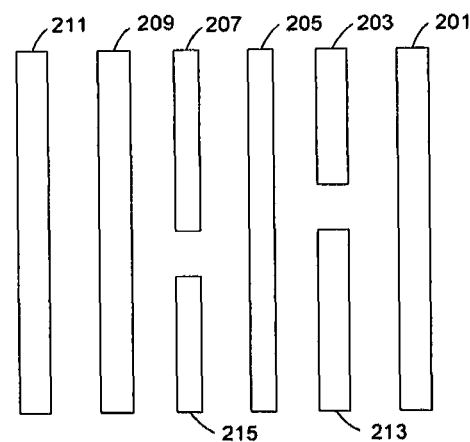
FIG. 2 shows a plan view of the gate electrode layer of an example logic circuit with two different conductive segment line-widths, and with conductive segment line-widths grouped for the same optical resolution as a core pattern, in accordance with an example embodiment.

FIG. 2 shows a plan view of the gate electrode layer of an example logic circuit with two different conductive segment line-widths, and with conductive segment line-widths grouped for the same optical resolution as a core pattern, in accordance with an example embodiment. The conductive segments of a first larger line width are represented by shapes 201, 203, 209, 211, and 213. The conductive segments of a second smaller line width are represented by shapes 205, 207, and 215.

Figure 3:
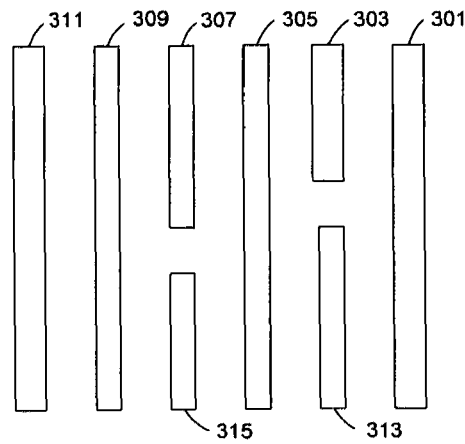
FIG. 3 shows a plan view of the gate electrode layer of an example logic circuit with two different conductive segment line-widths, and with line-widths patterned with a resolution higher than used for the core pattern, in accordance with an example embodiment.

FIG. 3 shows a plan view of the gate electrode layer of an example logic circuit with two different conductive segment line-widths, and with line-widths patterned with a resolution higher than used for the core pattern, in accordance with an example embodiment. The conductive segments of a first larger line width are represented by shapes 301, 303, and 311. The conductive segments of a second smaller line width are represented by shapes 305, 307, 309, 313, and 315.

Figure 4:
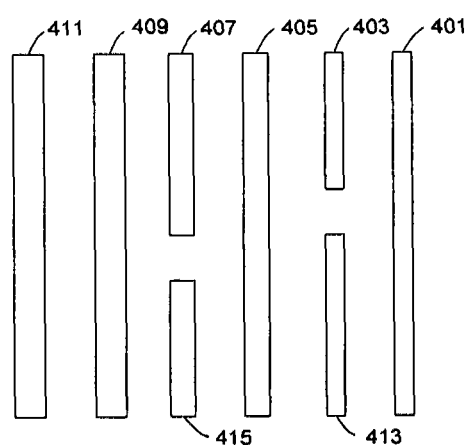
FIG. 4 shows a plan view of the gate electrode layer of an example logic circuit with three different conductive segment line-widths, and with line-widths grouped for the same optical resolution as a core pattern, in accordance with an example embodiment.

FIG. 4 shows a plan view of the gate electrode layer of an example logic circuit with three different conductive segment line-widths, and with line-widths grouped for the same optical resolution as a core pattern, in accordance with an example embodiment. The conductive segments of a first larger line width are represented by shapes 409 and 411. The conductive segments of a second smaller line width are represented by shapes 405, 407, and 415. The conductive segments of a third smallest line width are represented by shapes 401, 403, and 413.

Figure 5A:
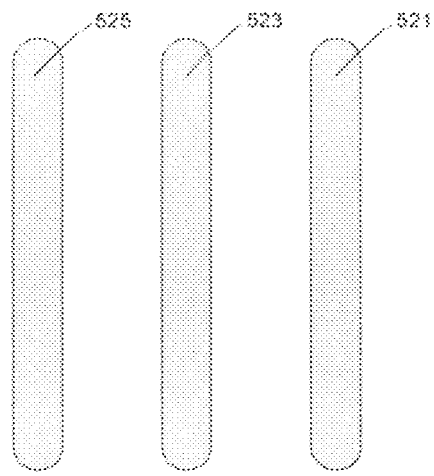
FIG. 5A shows a plan view, i.e., top view, of a core pattern for use in forming a gate electrode layer of an example logic circuit, in accordance with an example embodiment.

FIG. 5A shows a plan view, i.e., top view, of a core pattern for use in forming a gate electrode layer of an example logic circuit, in accordance with an example embodiment. The core pattern includes core structures 521, 523, and 525. The core structures 521, 523, and 525 are temporary structures that are formed of a material that can be subsequently removed. For example, the core structures 521, 523, and 525 can be formed of photoresist material or advanced patterning film (APF), among other types of materials. The core pattern is formed above a conductive layer that is to be formed into conductive segments to create the gate electrode layer.

Figure 5B:
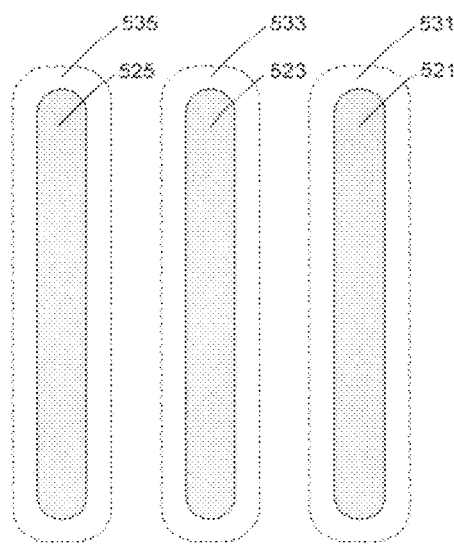
FIG. 5B shows the plan view of the core pattern of FIG. 5A following dielectric deposition and etching processes to form sidewall filaments 531, 533, and 535, in accordance with an example embodiment.

FIG. 5B shows the plan view of the core pattern of FIG. 5A following dielectric deposition and etching processes to form sidewall filaments 531, 533, and 535, in accordance with an example embodiment. The sidewall filaments are formed of a material that is suitable for use as a hard-mask material for subsequent etching of the underlying conductive layer that is to be formed into conductive segments to create the gate electrode layer.

Figure 5C:
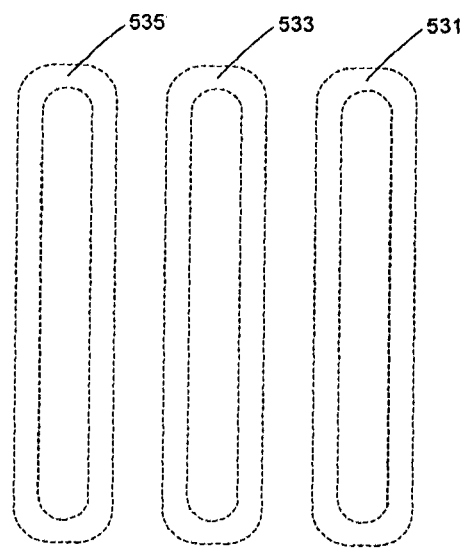
FIG. 5C shows the plan view of the sidewall filaments 531, 533, 535 of FIG. 5B after the core pattern, including core structures 521, 523, and 525, has been removed, in accordance with an example embodiment.

FIG. 5C shows the plan view of the sidewall filaments 531, 533, 535 of FIG. 5B after the core pattern, including core structures 521, 523, and 525, has been removed, in accordance with an example embodiment.

Figure 5D:
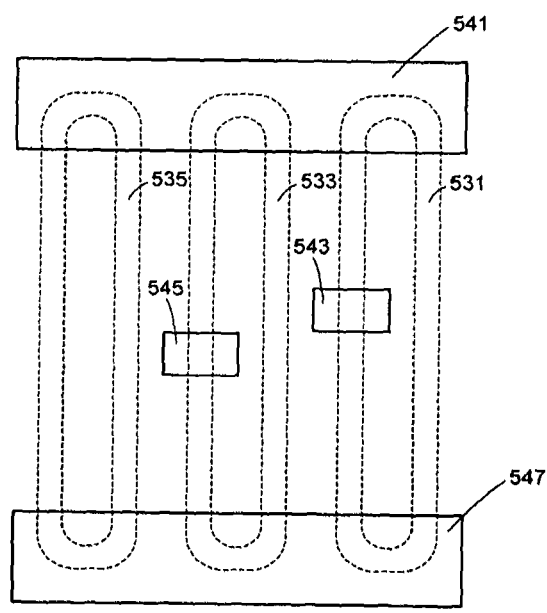
FIG. 5D shows a plan view of a cut pattern overlying the sidewall filaments 531, 533, 535 of FIG. 5C, prior to etching the sidewall filaments 531, 533, 535 in the cut pattern areas 541, 543, 545, and 547, in accordance with an example embodiment.

FIG. 5D shows a plan view of a cut pattern overlying the sidewall filaments 531, 533, 535 of FIG. 5C, prior to etching the sidewall filaments 531, 533, 535 in the cut pattern areas 541, 543, 545, and 547, in accordance with an example embodiment.

Figure 5E:
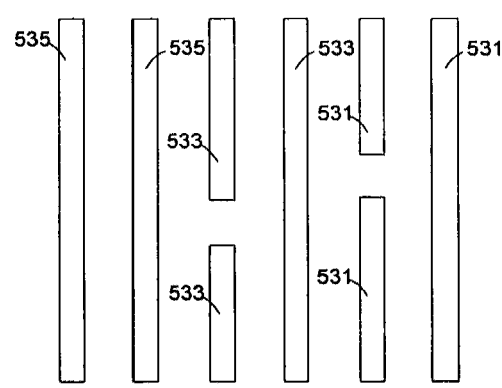
FIG. 5E shows the plan view of the sidewall filaments 531, 533, 535 of FIG. 5D after they have been etched within the cut pattern areas 541, 543, 545, and 547 as shown in FIG. 5D, in accordance with an example embodiment.

FIG. 5E shows the plan view of the sidewall filaments 531, 533, 535 of FIG. 5D after they have been etched within the cut pattern areas 541, 543, 545, and 547 as shown in FIG. 5D, in accordance with an example embodiment. At this point, the sidewall filaments 531, 533, 535 form a patterned hard mask that can be used to etch the underlying conductive material layer to form conductive structures within a gate electrode layer of the example logic circuit.

Figure 6A:
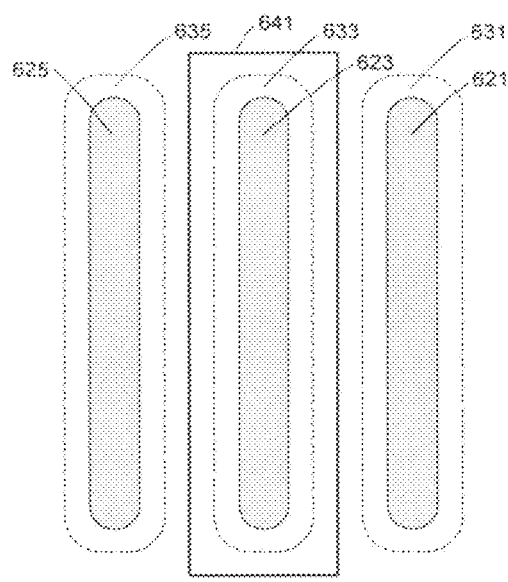
FIG. 6A shows a plan view, i.e., top view, of a core pattern that includes core structures 621, 623, and 625, surrounded by sidewall filaments 631, 633, and 635, respectively, in accordance with an example embodiment.

FIG. 6A shows a plan view, i.e., top view, of a core pattern that includes core structures 621, 623, and 625, surrounded by sidewall filaments 631, 633, and 635, respectively, in accordance with an example embodiment. In one embodiment, the core pattern and surrounding sidewall filaments 631, 633, and 635 of FIG. 6A are formed as part of a hard mask creation process, wherein the hard mask is to be used for etching an underlying conductive layer of material to form conductive structures within a gate electrode layer of an integrated circuit device. As with the previous example of FIGS. 5A-5E, the sidewall filaments 631, 633, and 635 can be formed around the core structures 621, 623, and 625 by dielectric deposition and etching processes, by way of example. FIG. 6A also shows an opening 641 in a mask pattern that is deposited to overly the core structures 621, 623, 625, and sidewall filaments 631, 633, 635. In this example, the mask pattern covers core structures 621, 625 and their surrounding sidewall filaments 631 and 635. The opening 641 in the mask pattern exposes the sidewall filament 633 to an etching process. In this manner, the sidewall filament 633 can be etched to reduce its width, as measured outward from the core structure 623, without affecting the sizes of sidewall filaments 631 and 635. Therefore, sidewall filament 633 can be selectively adjusted in size, i.e., width.

Figure 6B:
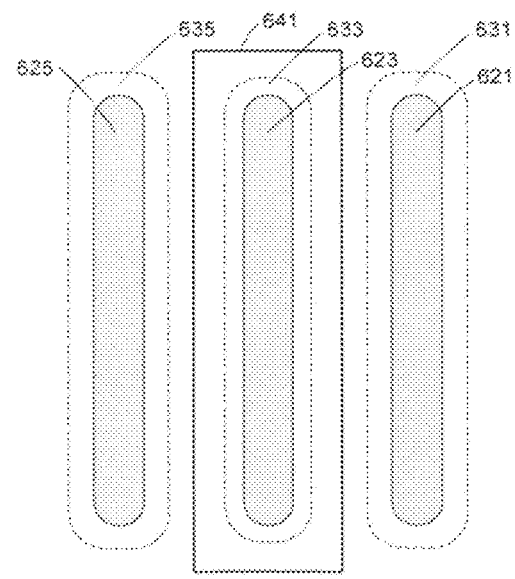
FIG. 6B shows the plan view of FIG. 6A after the etching process to reduce the width of the sidewall filament 633 that is exposed through the mask opening 641, in accordance with an example embodiment.

FIG. 6B shows the plan view of FIG. 6A after the etching process to reduce the width of the sidewall filament 633 that is exposed through the mask opening 641, in accordance with an example embodiment.

Figure 6C:
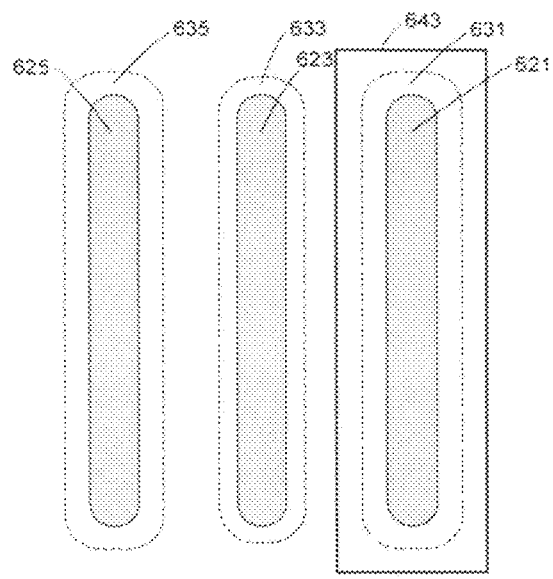
FIG. 6C shows the plan view of FIG. 6B after the first etching process to reduce the width of the sidewall filament 633, in accordance with an example embodiment.

FIG. 6C shows the plan view of FIG. 6B after the first etching process to reduce the width of the sidewall filament 633, in accordance with an example embodiment. FIG. 6C also shows the overlying mask pattern (that is deposited to overly the core structures 621, 623, 625, and sidewall filaments 631, 633, 635) adjusted to have an opening 643 which exposes the sidewall filament 631 without exposing the other sidewall filaments 633 and 635. With the sidewall filament 631 selectively exposed by way of the mask opening 643, the sidewall filament 631 can be etched to independently adjust its width size.

Figure 6D:
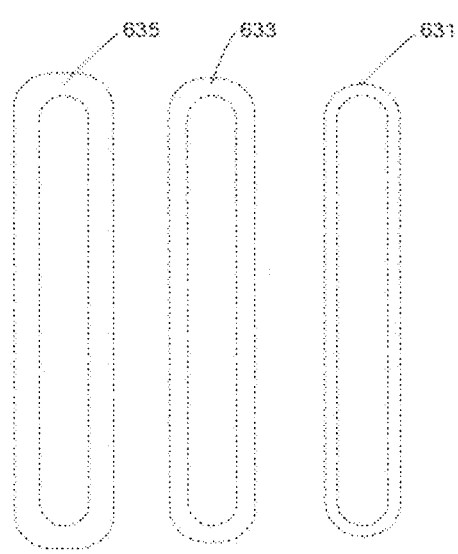
FIG. 6D shows the plan view of FIG. 6C after the second etching process to reduce the width of the sidewall filament 631, in accordance with an example embodiment.

FIG. 6D shows the plan view of FIG. 6C after the second etching process to reduce the width of the sidewall filament 631, in accordance with an example embodiment. FIG. 6D also shows the core structures 621, 623, 625 removed. The sidewall filaments 631, 633, and 635 now have differing widths, and can be cut as needed, similar to the examples of FIGS. 5D-5E, to define a hard mask for etching of an underlying conductive material layer.

Figure 7A:
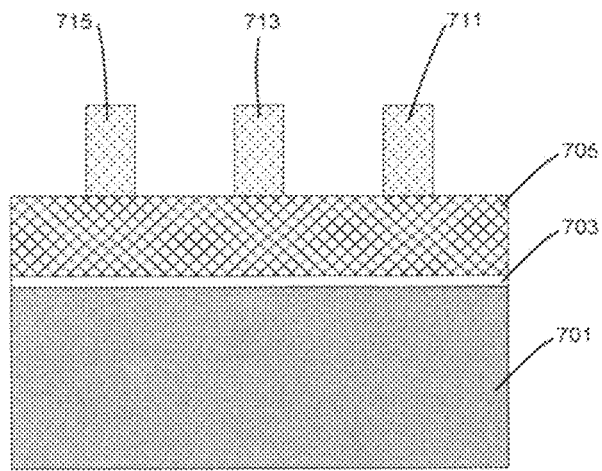
FIG. 7A shows vertical cross-section view of a core pattern for use in forming a gate electrode layer of an example logic circuit, in accordance with an example embodiment.

FIG. 7A shows vertical cross-section view of a core pattern for use in forming a gate electrode layer of an example logic circuit, in accordance with an example embodiment. The cross-section shows a substrate 701, a gate dielectric material layer 703 deposited on the substrate 701, and a gate conductor material layer 705 deposited on the gate dielectric material layer 703. The cross-section also shows core structures 711, 713, and 715 formed on the gate conductor material layer 705. It should be understood that the core structures 711, 713, and 715 are formed through a deposition, mask patterning, and etching process conducted above the gate conductor material layer 705.

Figure 7B:
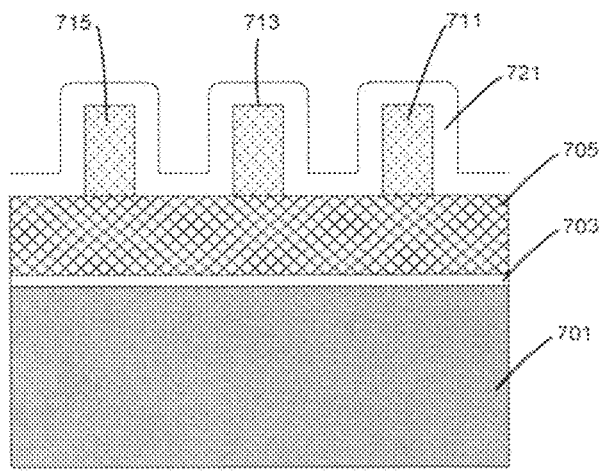
FIG. 7B shows the cross-section view of FIG. 7A, after deposition of a material layer 721 which will later become sidewall filaments, in accordance with an example embodiment.

FIG. 7B shows the cross-section view of FIG. 7A, after deposition of a material layer 721 which will later become sidewall filaments, in accordance with an example embodiment.

Figure 7C:
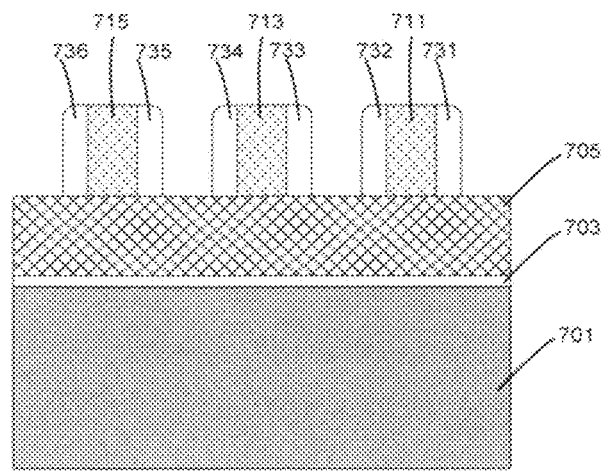
FIG. 7C shows the cross-section view of FIG. 7B, after the material layer 721 has been etched to transform it into sidewall filaments 731, 732, 733, 734, 735, 736 formed along sides of the core structures 711, 713, 715, in accordance with an example embodiment.

FIG. 7C shows the cross-section view of FIG. 7B, after the material layer 721 has been etched to transform it into sidewall filaments 731, 732, 733, 734, 735, 736 formed along sides of the core structures 711, 713, 715, in accordance with an example embodiment.

Figure 7D:
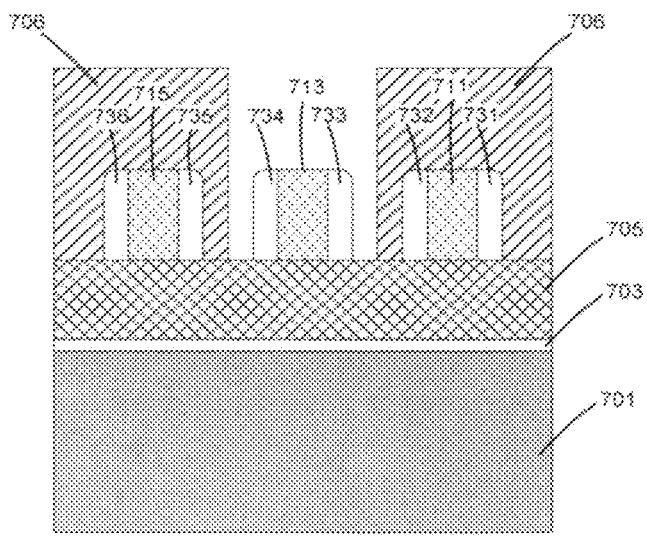
FIG. 7D shows the cross-section view of FIG. 7C with a mask material 706 deposited to cover the core structures 711, 715, and their sidewall filaments 731, 732, 735, 736, and leave the core structure 713 and its sidewall filaments 733, 734 exposed, in accordance with an example embodiment.

FIG. 7D shows the cross-section view of FIG. 7C with a mask material 706 deposited to cover the core structures 711, 715, and their sidewall filaments 731, 732, 735, 736, and leave the core structure 713 and its sidewall filaments 733, 734 exposed, in accordance with an example embodiment. The mask material 706 protects the core structures 711, 715, and their sidewall filaments 731, 732, 735, 736 from a subsequent etching process, and thereby enables further selective etching of the sidewall filaments 733, 734.

Figure 7E:
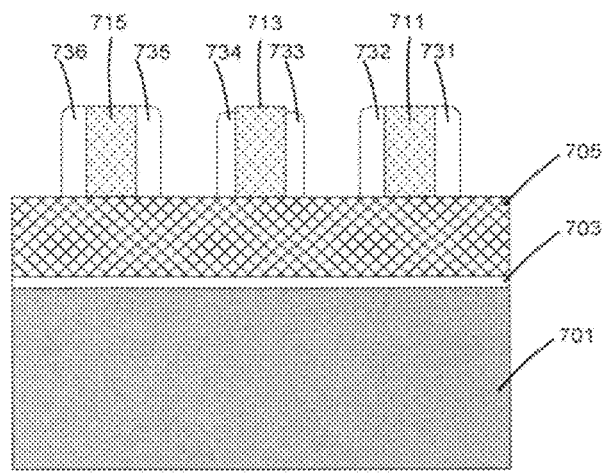
FIG. 7E shows the cross-section view of FIG. 7C, after the sidewall filaments 733 and 734 have been selectively etched to reduce their width sizes, in accordance with an example embodiment.

FIG. 7E shows the cross-section view of FIG. 7C, after the sidewall filaments 733 and 734 have been selectively etched to reduce their width sizes, in accordance with an example embodiment. As illustrated by the example in FIGS. 6A-6B, a mask layer can be formed with an opening defined to expose the core structure 713 and its surrounding sidewall filaments 733 and 734 to enable the selective etching, i.e., selective width size adjustment, of the sidewall filaments 733 and 734, relative to the other sidewall filaments 731, 732, 735, and 736.

Figure 7F:
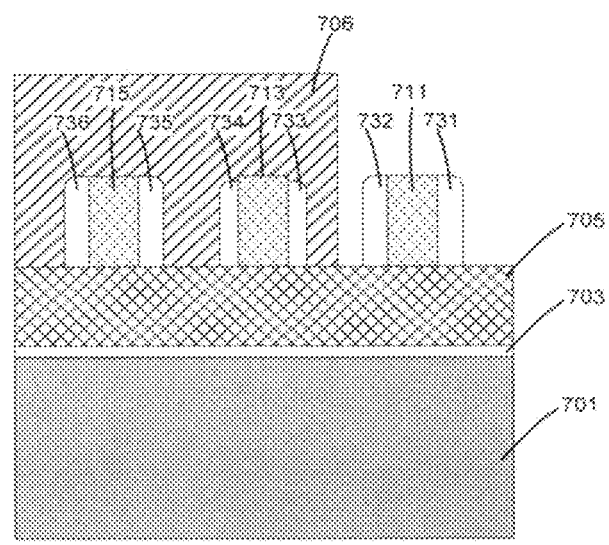
FIG. 7F shows the cross-section view of FIG. 7E with a mask material 706 deposited to cover the core structures 713, 715, and their sidewall filaments 733, 734, 735, 736, and leave the core structure 711 and its sidewall filaments 731, 732 exposed, in accordance with an example embodiment.

FIG. 7F shows the cross-section view of FIG. 7E with a mask material 706 deposited to cover the core structures 713, 715, and their sidewall filaments 733, 734, 735, 736, and leave the core structure 711 and its sidewall filaments 731, 732 exposed, in accordance with an example embodiment. The mask material 706 protects the core structures 713, 715, and their sidewall filaments 733, 734, 735, 736 from a subsequent etching process, and thereby enables further selective etching of the sidewall filaments 731, 732.

Figure 7G:
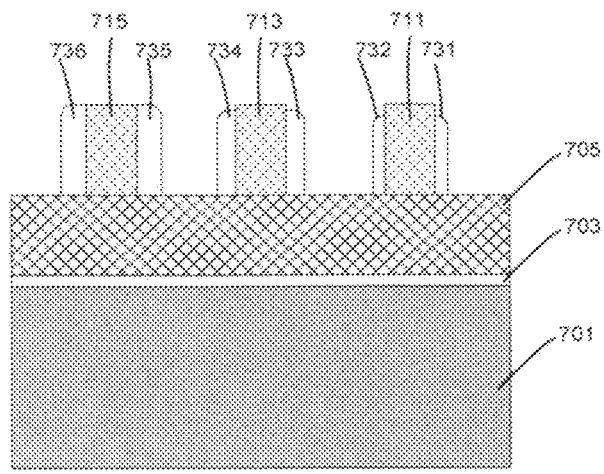
FIG. 7G shows the cross-section view of FIG. 7E, after the sidewall filaments 731 and 732 have been selectively etched to reduce their width sizes, in accordance with an example embodiment.

FIG. 7G shows the cross-section view of FIG. 7E, after the surrounding sidewall filaments 731 and 732 have been selectively etched to reduce their width sizes, in accordance with an example embodiment. As illustrated by the example in FIGS. 6C-6D, a mask layer can be formed with an opening defined to expose the core structure 711 and its surrounding sidewall filaments 731 and 732 to enable the selective etching, i.e., selective width size adjustment, of the sidewall filaments 731 and 732, relative to the other sidewall filaments 733, 734, 735, and 736.

Figure 7H:
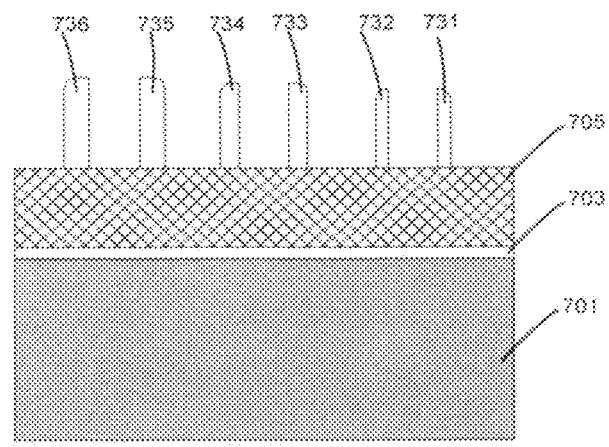
FIG. 7H shows the cross-section view of FIG. 7G, after the core structures 711, 713, 715 have been removed, in accordance with an example embodiment.
Figure 7I:
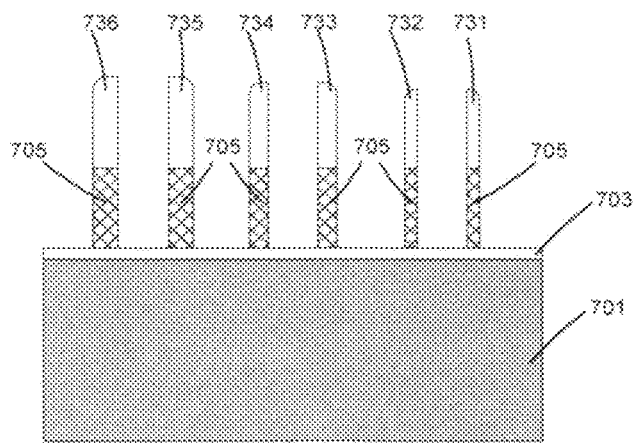
FIG. 7I hows the cross-section view of FIG. 7H, after the underlying gate conductor material layer 705 has been etched in regions between the sidewall filaments 731, 732, 733, 734, 735, 736, in accordance with an example embodiment.
Figure 7J:
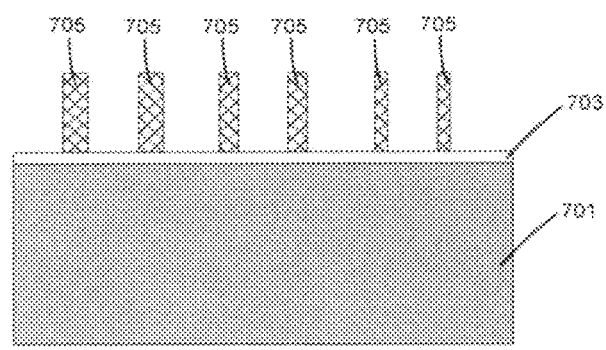
FIG. 7J shows the cross-section view of FIG. 7I, after the sidewall filaments 731, 732, 733, 734, 735, 736 have been removed, thereby leaving the etched gate conductor material layer 705, in accordance with an example embodiment.

FIG. 7H shows the cross-section view of FIG. 7G, after the core structures 711, 713, 715 have been removed, in accordance with an example embodiment. The sidewall filaments 731, 732, 733, 734, 735, 736 provide a mask for etching the underlying gate conductor material layer 705. FIG. 7I shows the cross-section view of FIG. 7H, after the underlying gate conductor material layer 705 has been etched in regions between the sidewall filaments 731, 732, 733, 734, 735, 736, in accordance with an example embodiment. FIG. 7J shows the cross-section view of FIG. 7I, after the sidewall filaments 731, 732, 733, 734, 735, 736 have been removed, thereby leaving the etched gate conductor material layer 705, in accordance with an example embodiment.

Figure 8A:
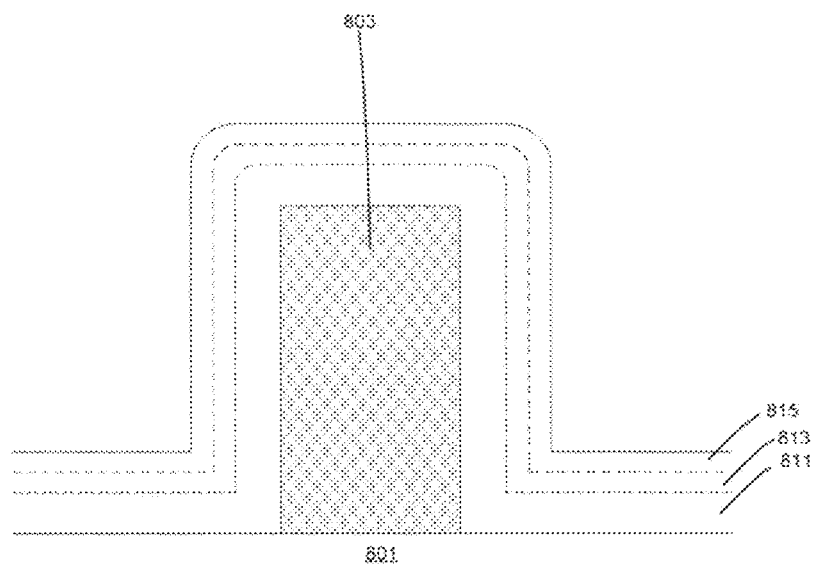
FIG. 8A shows a vertical cross-section view of a core structure 803 formed on a conductive material layer 801 (e.g., gate conductor material layer 801), in accordance with an example embodiment.

FIG. 8A shows a vertical cross-section view of a core structure 803 formed on a conductive material layer 801 (e.g., gate conductor material layer 801), in accordance with an example embodiment. FIG. 8A also shows three different sidewall filament material layers 811, 813, and 815 sequentially and conformally deposited over the core structure 803 and surrounding/adjacent conductive material layer 801.

Figure 8B:
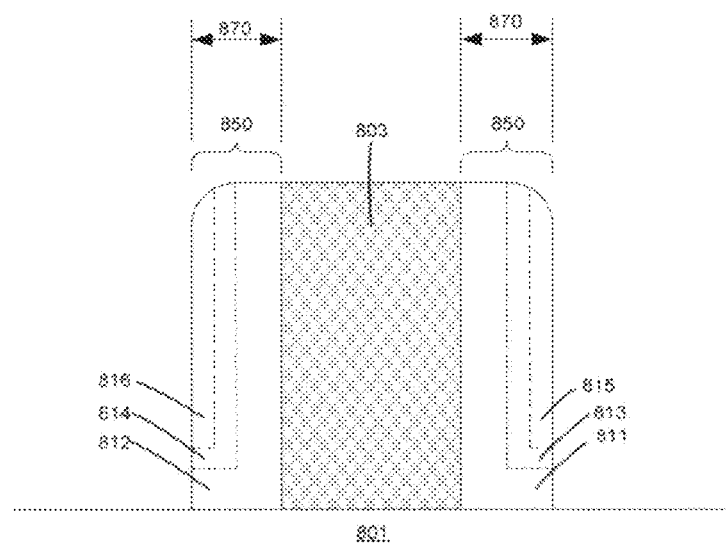
FIG. 8B shows the cross-section view of FIG. 8A, after an etching process which leaves a full-width sidewall filament 850, in accordance with an example embodiment.
Figure 8C:
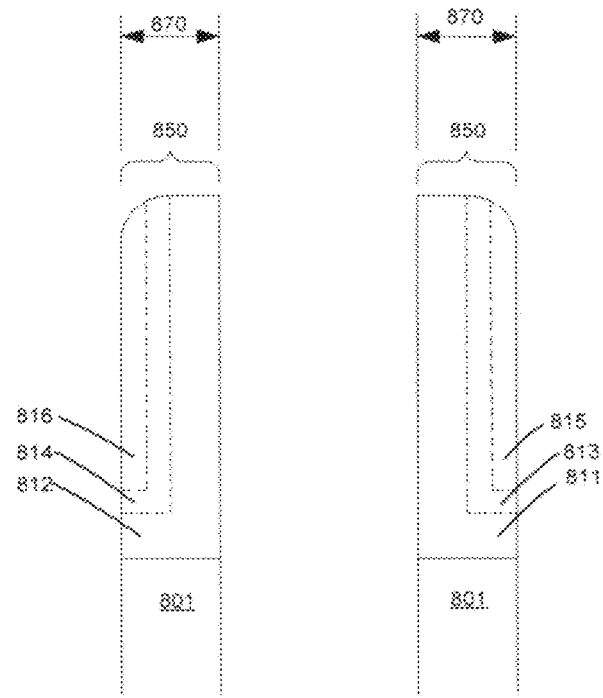
FIG. 8C shows the cross-section view of FIG. 8B, after the core structure 803 has been removed, and the sidewall filaments 850 have been used as a mask for etching the underlying gate conductor material layer 801, in accordance with an example embodiment.

FIG. 8B shows the cross-section view of FIG. 8A, after an etching process which leaves a full-width sidewall filament 850, in accordance with an example embodiment. Considering that the sidewall filament 850 will serve as a hard mask to protect the underlying gate conductor material layer 801 during a subsequent etching process to form conductive segments within the gate electrode layer, and further considering that the core structure 803 will be removed prior to the subsequent etching process on the gate conductor material layer 801, the width size 870 of the sidewall filament 850 effectively defines the width size of the conductive segment to be formed within the gate conductor material layer 801. FIG. 8C shows the cross-section view of FIG. 8B, after the core structure 803 has been removed, and the sidewall filaments 850 have been used as a mask for etching the underlying gate conductor material layer 801, in accordance with an example embodiment.

Figure 8D:
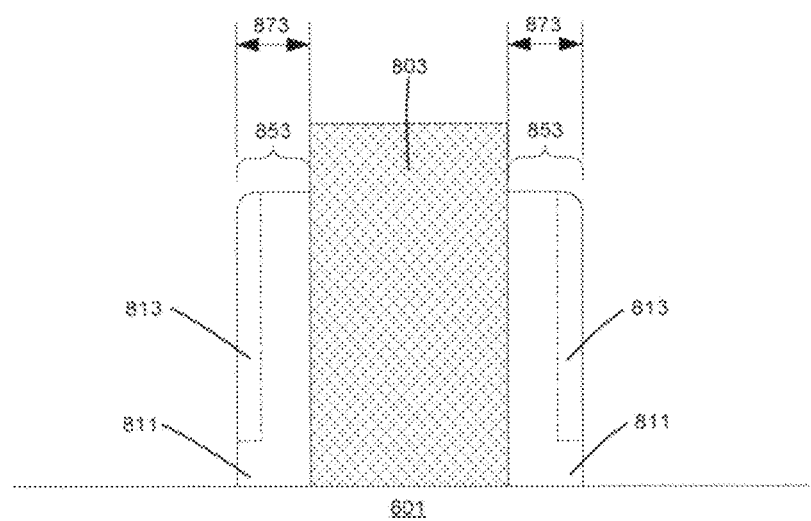
FIG. 8D shows the cross-section of FIG. 8B following a further etching process to obtain sidewall filaments 853 of reduced width 873, relative to the sidewall filaments 850 of FIG. 8B, in accordance with an example embodiment.

Considering that the conductive segment formed within the gate conductor material layer 801 below the sidewall filament 850 is a gate electrode of a transistor, the width size 870 of the gate electrode of the transistor (which may also be referred to as the transistor's channel length) can be adjusted by adjusting the width size 870 of the sidewall filament. FIG. 8D shows the cross-section of FIG. 8B following a further etching process to obtain sidewall filaments 853 of reduced width 873, relative to the sidewall filaments 850 of FIG. 8B, in accordance with an example embodiment. It should be understood that the etching of the sidewall filaments can be controlled, by way of a mask pattern, such that either one or both of the sidewall filaments adjacent to the core structure 803 is etched, i.e., thinned. Also, it should be understood that the layered deposition of the sidewall filament material in the layers 811, 813, and 815 can provide control of sidewall filament etching, such that the etching will stop at the boundaries between the successively removed sidewall filament material layers.

Figure 8E:
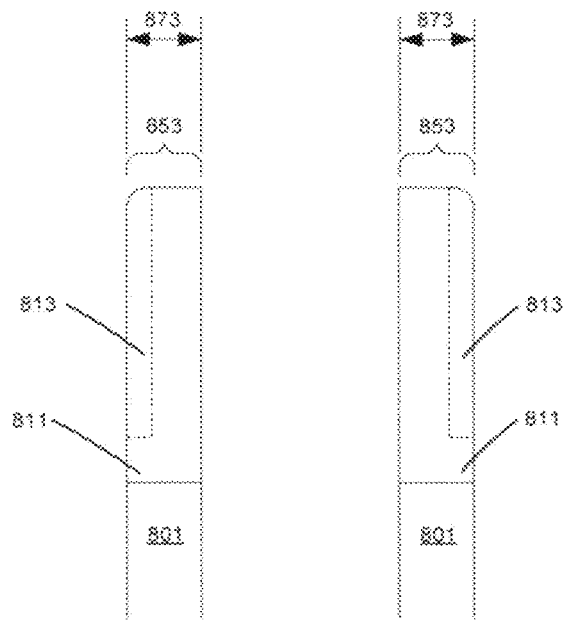
FIG. 8E shows the cross-section view of FIG. 8D, after the core structure 803 and outside sidewall filament layer 815 have been removed, and the sidewall filaments 853 have been used as a mask for etching the underlying gate conductor material layer 801, in accordance with an example embodiment.
Figure 8F:
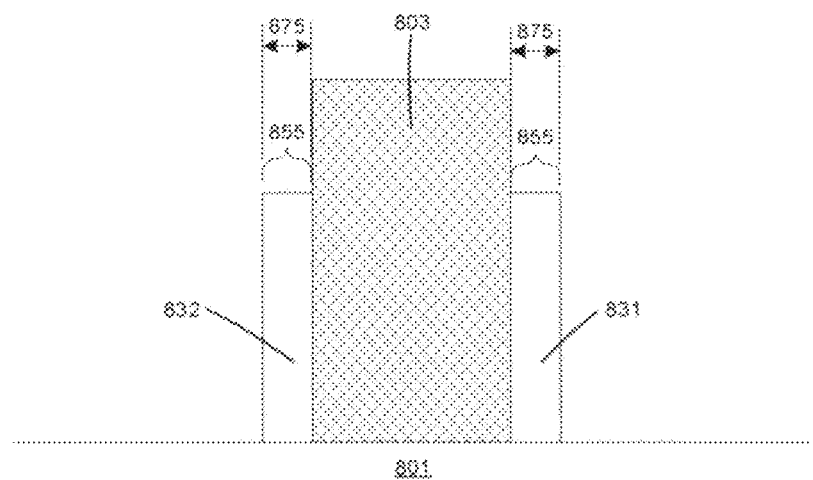
FIG. 8F shows the cross-section of FIG. 8D following a further etching process to reduce the sidewall filament 855 width 875 to essentially the thickness of the first deposited sidewall filament material layer 811, in accordance with an example embodiment.
Figure 8G:
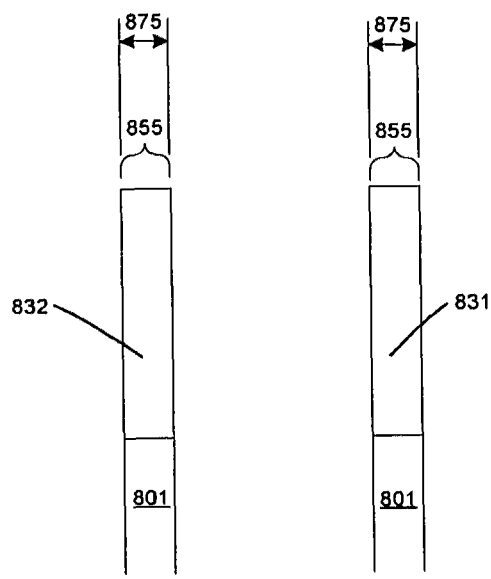
FIG. 8G shows the cross-section view of FIG. 8F, after the core structure 803 and sidewall filament layer 813 have been removed, and the sidewall filaments 855 have been used as a mask for etching the underlying gate conductor material layer 801, in accordance with an example embodiment.

FIG. 8E shows the cross-section view of FIG. 8D, after the core structure 803 and outside sidewall filament layer 815 have been removed, and the sidewall filaments 853 have been used as a mask for etching the underlying gate conductor material layer 801, in accordance with an example embodiment. FIG. 8F shows the cross-section of FIG. 8D following a further etching process to reduce the sidewall filament 855 width 875 to essentially the thickness of the first deposited sidewall filament material layer 811, in accordance with an example embodiment. FIG. 8G shows the cross-section view of FIG. 8F, after the core structure 803 and sidewall filament layer 813 have been removed, and the sidewall filaments 855 have been used as a mask for etching the underlying gate conductor material layer 801, in accordance with an example embodiment.

The examples of FIGS. 8A-8G utilized successively deposited sidewall filament material layers to provide a measure of etching control for the sidewall filaments, such that boundaries between the successively deposited sidewall filament material layers provided etching stops to facilitate sizing of the sidewall filaments, and correspondingly formed underlying gate electrode layer conductive structures. However, some etching processes may enable sidewall filament thickness control without requiring sidewall material layer boundaries.

Figure 9A:
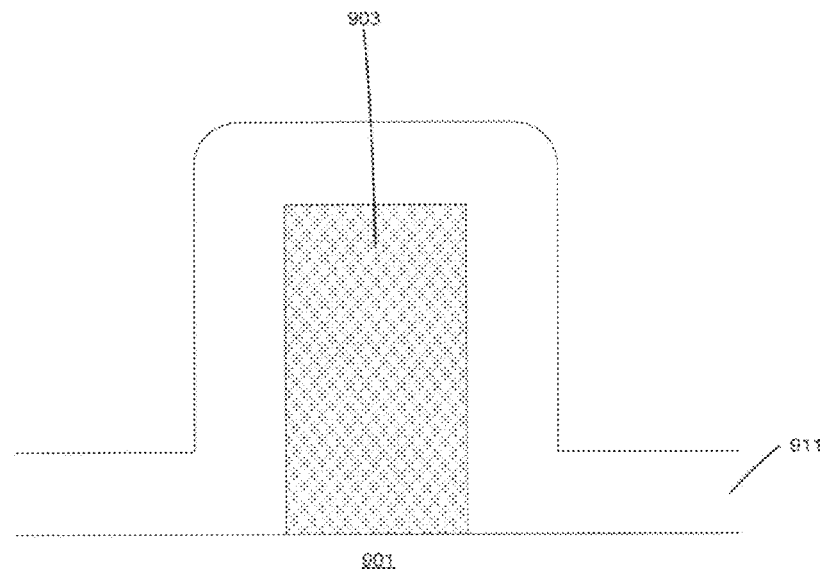
FIG. 9A shows a vertical cross-section view of a core structure 903 formed on a conductive material layer 901 (e.g., gate conductor material layer 901), in accordance with an example embodiment.

For example, FIG. 9A shows a vertical cross-section view of a core structure 903 formed on a conductive material layer 901 (e.g., gate conductor material layer 901), in accordance with an example embodiment. FIG. 9A also shows a single sidewall filament material layer 911 conformally deposited over the core structure 903 and surrounding/adjacent conductive material layer 901.

Figure 9B:
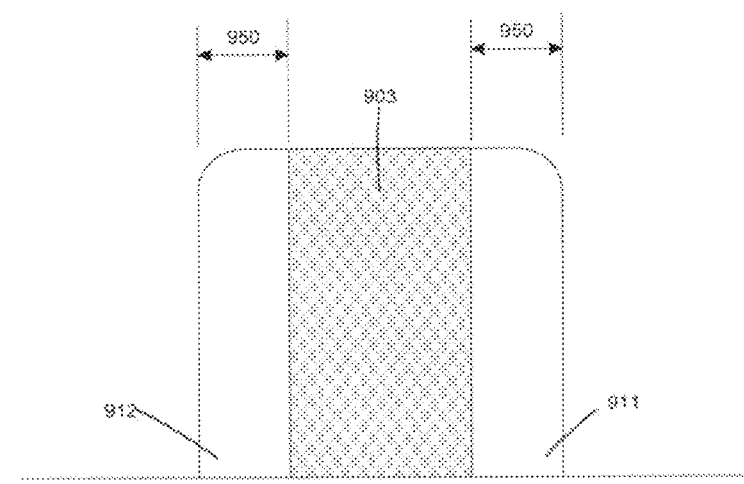
FIG. 9B shows the cross-section view of FIG. 9A, after an etching process which leaves sidewall filaments 911 and 912 of width size 950, in accordance with an example embodiment.
Figure 9C:
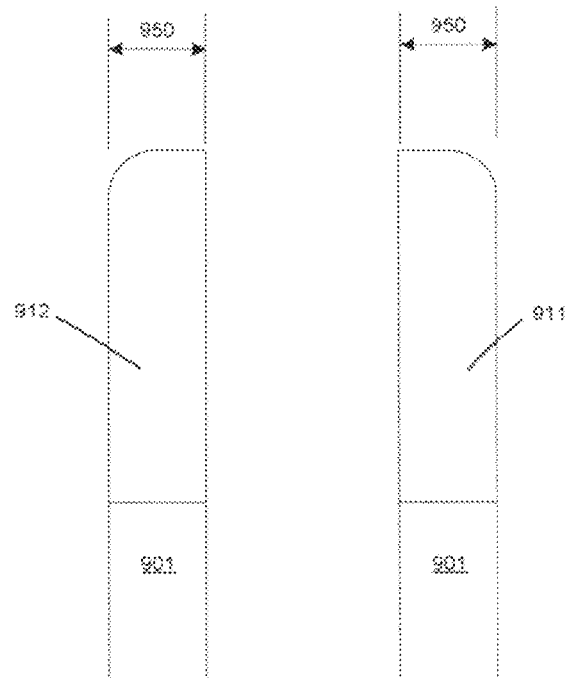
FIG. 9C shows the cross-section view of FIG. 9B, after the core structure 903 has been removed, and the sidewall filaments 911, 912 have been used as a mask for etching the underlying gate conductor material layer 901, in accordance with an example embodiment.

FIG. 9B shows the cross-section view of FIG. 9A, after an etching process which leaves sidewall filaments 911 and 912 of width size 950, in accordance with an example embodiment. The width size 950 may represent a largest gate electrode layer conductive segment width size. In this case, the sidewall filaments 911 and 912 are ready to use as the hard mask for etching of the underlying gate conductor material layer 901. FIG. 9C shows the cross-section view of FIG. 9B, after the core structure 903 has been removed, and the sidewall filaments 911, 912 have been used as a mask for etching the underlying gate conductor material layer 901, in accordance with an example embodiment.

Figure 9D:
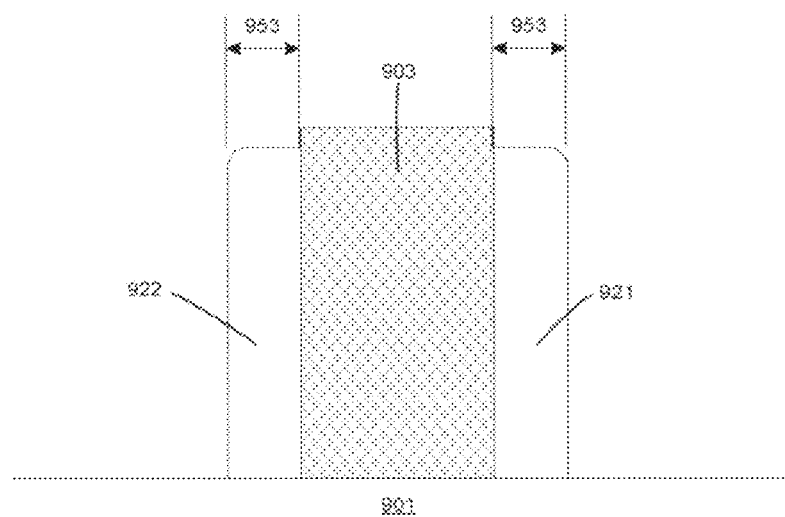
FIG. 9D shows the cross-section of FIG. 9B, after further etching of the sidewall filaments 911 and 912 to obtain sidewall filaments 921 and 922 of reduced width size 953, in accordance with an example embodiment.
Figure 9E:
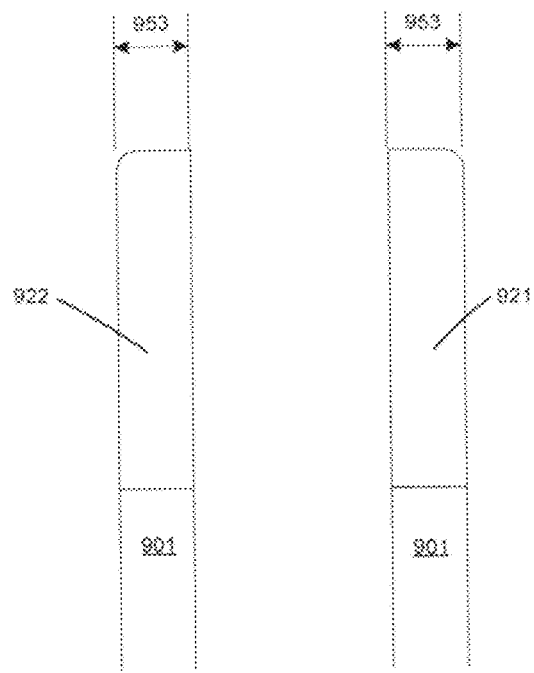
FIG. 9E shows the cross-section view of FIG. 9D, after the core structure 903 has been removed, and the sidewall filaments 921, 922 have been used as a mask for etching the underlying gate conductor material layer 901, in accordance with an example embodiment.

It may be necessary to form gate electrode layer conductive segments of reduced size. In this case, the etching of the sidewall filaments can continue until the desired width size is obtained. Again, it should be understood that appropriately formed mask patterns can expose any one or more sidewall filaments for etching and size adjustment. For example, FIG. 9D shows the cross-section of FIG. 9B, after further etching of the sidewall filaments 911 and 912 to obtain sidewall filaments 921 and 922 of reduced width size 953, in accordance with an example embodiment. FIG. 9E shows the cross-section view of FIG. 9D, after the core structure 903 has been removed, and the sidewall filaments 921, 922 have been used as a mask for etching the underlying gate conductor material layer 901, in accordance with an example embodiment.

Figure 9F:
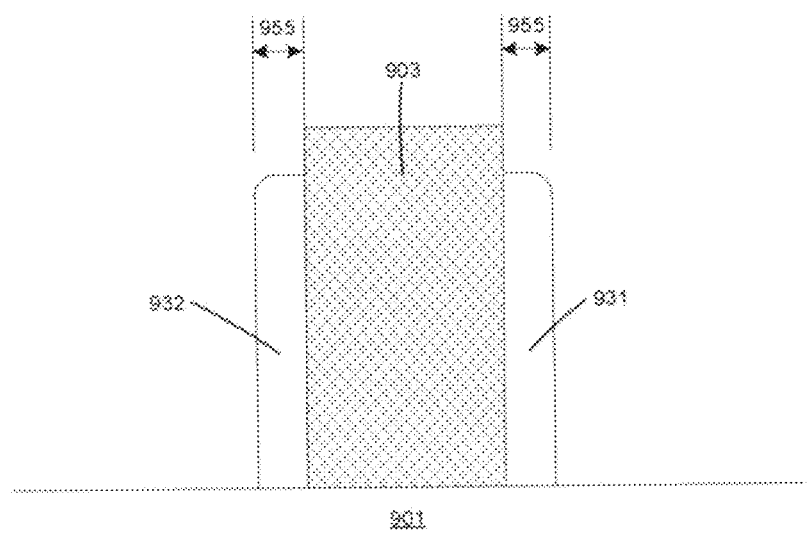
FIG. 9F shows the cross-section of FIG. 9D, after further etching of the sidewall filaments 921 and 922 to obtain sidewall filaments 931 and 932 of even further reduced width size 955, in accordance with an example embodiment.
Figure 9G:
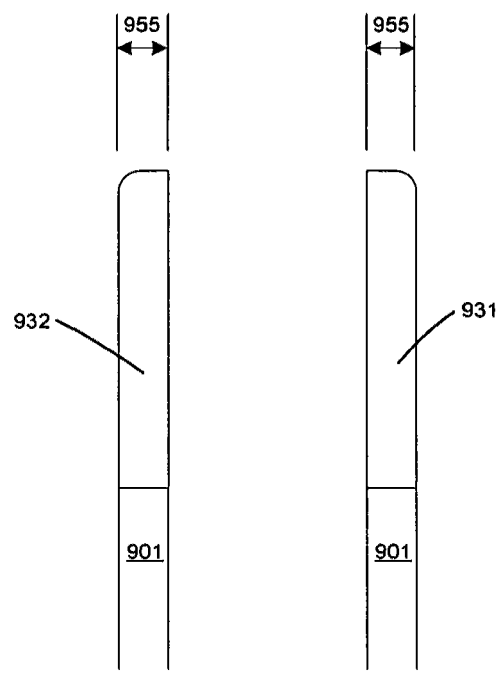
FIG. 9G shows the cross-section view of FIG. 9F, after the core structure 903 has been removed, and the sidewall filaments 931, 932 have been used as a mask for etching the underlying gate conductor material layer 901, in accordance with an example embodiment.

Additionally, FIG. 9F shows the cross-section of FIG. 9D, after further etching of the sidewall filaments 921 and 922 to obtain sidewall filaments 931 and 932 of even further reduced width size 955, in accordance with an example embodiment. FIG. 9G shows the cross-section view of FIG. 9F, after the core structure 903 has been removed, and the sidewall filaments 931, 932 have been used as a mask for etching the underlying gate conductor material layer 901, in accordance with an example embodiment.

Figure 10:
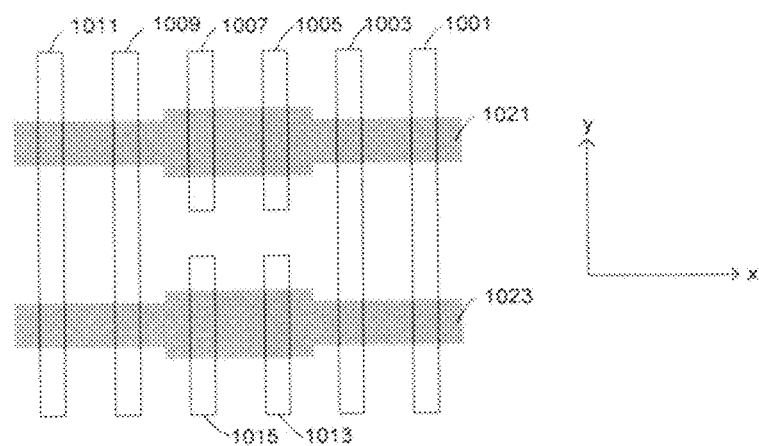
FIG. 10 shows a plan view of the gate electrode layer of a portion of an example SRAM cell with gate electrode layer conductive segments (1001, 1003, 1005, 1007, 1009, 1011, 1013, 1015) of uniform width size, as measured in the direction (x), in accordance with an example embodiment.

FIG. 10 shows a plan view of the gate electrode layer of a portion of an example SRAM cell with gate electrode layer conductive segments (1001, 1003, 1005, 1007, 1009, 1011, 1013, 1015) of uniform width size, as measured in the direction (x), in accordance with an example embodiment. Also, the example of FIG. 10 shows diffusion regions 1021 and 1023 of non-uniform size, i.e., of non-uniform active linewidths, to improve static noise margin. The principles disclosed herein with regard to FIGS. 1-9G can be used to form the gate electrode layer conductive segments (1001, 1003, 1005, 1007, 1009, 1011, 1013, 1015).

Figure 11:
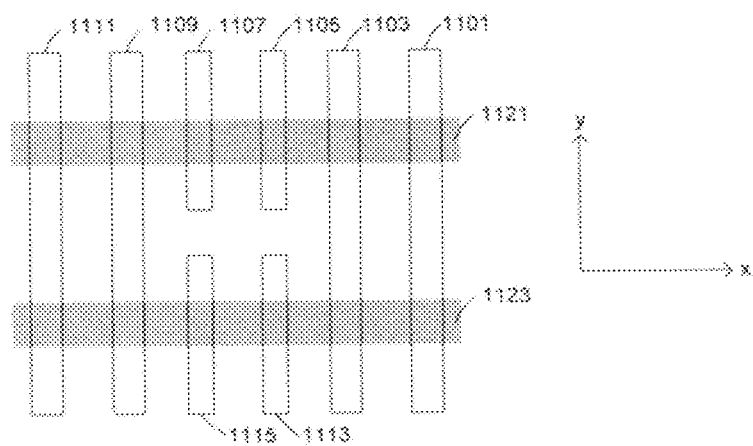
FIG. 11 shows a plan view of the gate electrode layer of a portion of an example SRAM cell with gate electrode layer conductive segments (1101, 1103, 1105, 1107, 1109, 1111, 1113, 1115) of non-uniform width size, as measured in the direction (x), in accordance with an example embodiment.

FIG. 11 shows a plan view of the gate electrode layer of a portion of an example SRAM cell with gate electrode layer conductive segments (1101, 1103, 1105, 1107, 1109, 1111, 1113, 1115) of non-uniform width size, as measured in the direction (x), in accordance with an example embodiment. Also, the example of FIG. 11 shows diffusion regions 1121 and 1123 of uniform size, i.e., of uniform active line-widths, to improve static noise margin. The principles disclosed herein with regard to FIGS. 1-9G can be used to form the gate electrode layer conductive segments (1101, 1103, 1105, 1107, 1109, 1111, 1113, 1115). This approach is suitable for FinFETs, in which the active regions, i.e., diffusion regions, are fins of uniform width.

The embodiments illustrated herein provide for patterning of the gate electrode layer, or for any layer that uses patterning that cannot be achieved by litho in a single step. Examples of other layers that may benefit from the embodiments shown herein can include metallization layers requiring multiple widths for power bussing etc. The patterning can be SDP patterning or litho-based double patterning. In one embodiment, the gate electrode layer (or other layer) line widths are selectively decreased by using a patterned trim step. In one embodiment, the gate electrode layer (or other layer) line widths are selectively increased by using a patterned resist reflow step. In one embodiment, the gate electrode layer (or other layer) patterning is completed by cutting the filaments based on a pattern set by the circuit layout.

Figure 12:
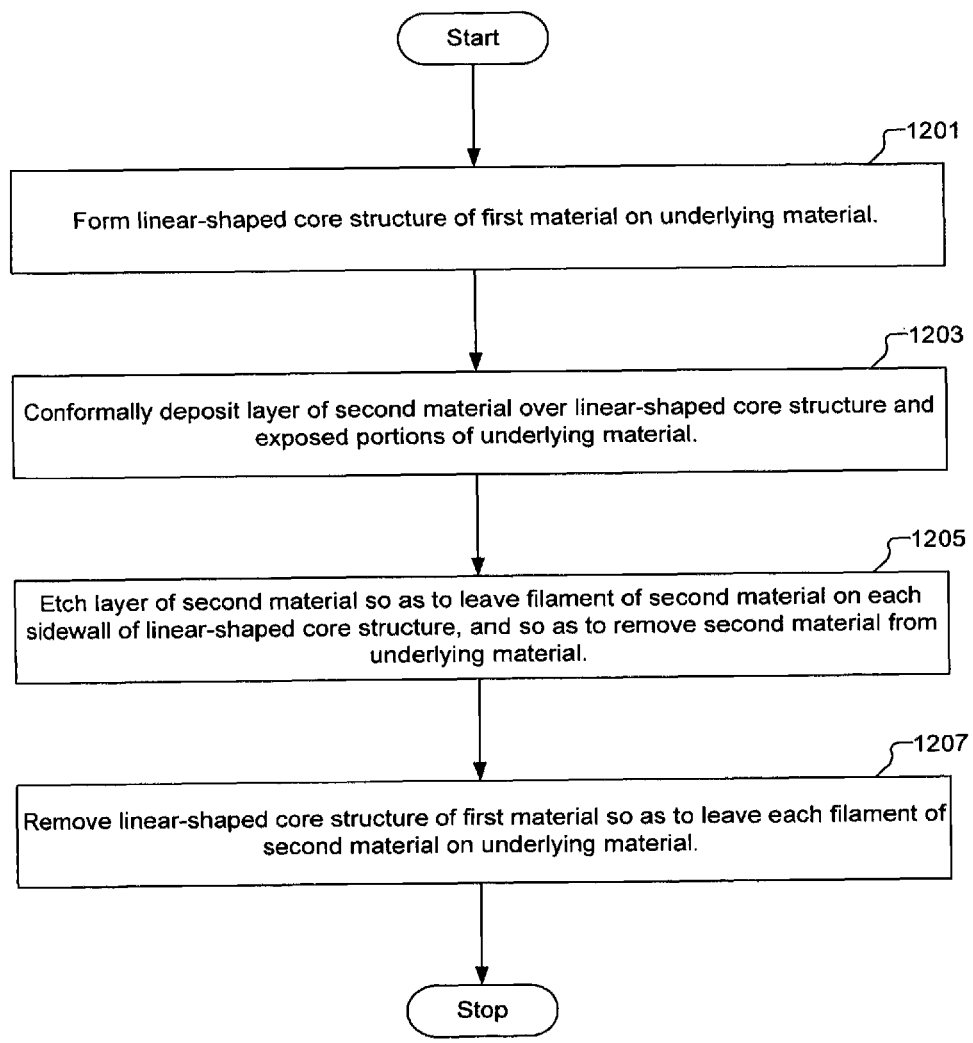
FIG. 12 shows a flowchart of a method for fabricating a mask for etching of linear-shaped structures for an integrated circuit, in accordance with one embodiment of the present invention.

FIG. 12 shows a flowchart of a method for fabricating a mask for etching of linear-shaped structures for an integrated circuit, in accordance with one embodiment of the present invention. The method includes an operation 1201 in which a linear-shaped core structure of a first material is formed on an underlying material. The method also includes an operation 1203 for conformally depositing a layer of a second material over the linear-shaped core structure and exposed portions of the underlying material. The method also includes an operation 1205 for etching the layer of the second material so as to leave a filament of the second material on each sidewall of the linear-shaped core structure, and so as to remove the second material from the underlying material. The method further includes an operation 1207 for removing the linear-shaped core structure of the first material so as to leave each filament of the second material on the underlying material, whereby each filament of the second material provides a mask for etching the underlying material.

In one embodiment, the linear-shaped core structure of the first material is formed on the underlying material in operation 1201 using a mask material patterned by an optical lithography process. Also, in this embodiment, the filaments of the second material on the underlying material collectively have dimensions and spacings too small to be directly formed by the optical lithography process. In another embodiment, the linear-shaped core structure of the first material is formed on the underlying material in operation 1201 using a multiple mask patterning process, wherein each mask of the multiple mask patterning process is formed by an optical lithography process. Also, in this embodiment, the filaments of the second material on the underlying material collectively have dimensions and spacings too small to be directly formed by the optical lithography process.

In one embodiment, operation 1205 for etching the layer of the second material includes removing the second material from a top surface of the linear-shaped core structure of the first material so as to expose the top surface of the linear-shaped core structure of the first material. Also, in one embodiment, etching the layer of the second material in operation 1205 includes biasing an etching front in a direction toward the underlying material. It should be appreciated that the first material and the second material have different etching selectivities to enable removal of the first material without substantial removal of the second material during a given etching process.

In one embodiment, the method further includes an operation in which a cut mask is formed over the filaments of the second material so as to expose portions of the filaments of the second material for removal, so as to form ends of linear segments of the filaments of the second material. In this embodiment, the method correspondingly includes an operation for removing exposed portions of the filaments of the second material, whereby the linear segments of the filaments of the second material provide the mask for etching the underlying material.

Figure 13:
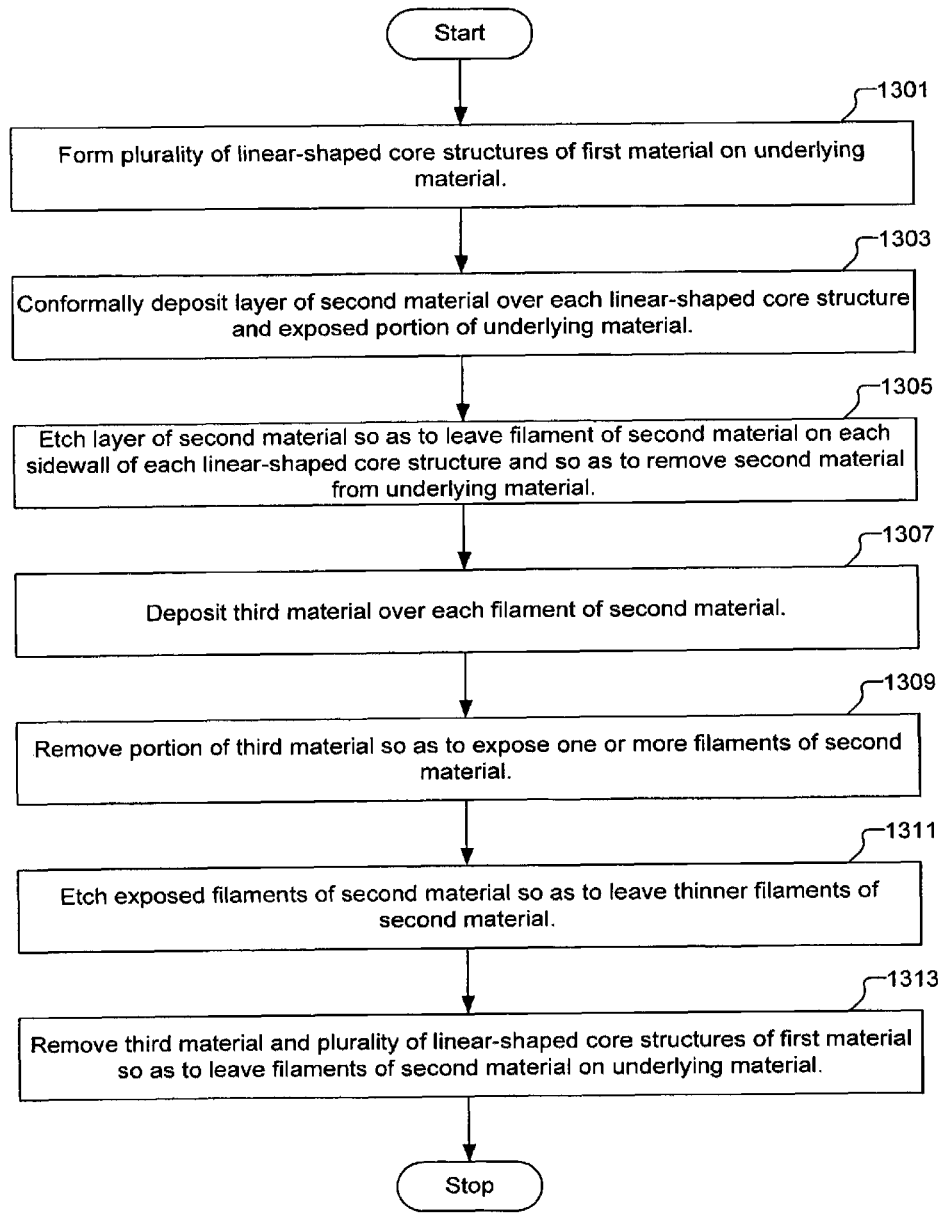
FIG. 13 shows a flowchart of a method for fabricating a mask for etching of linear-shaped structures for an integrated circuit, in accordance with one embodiment of the present invention.

FIG. 13 shows a flowchart of a method for fabricating a mask for etching of linear-shaped structures for an integrated circuit, in accordance with one embodiment of the present invention. The method includes an operation 1301 in which a plurality of linear-shaped core structures of a first material are formed on an underlying material. The method also includes an operation 1303 for conformally depositing a layer of a second material over each of the linear-shaped core structures and exposed portions of the underlying material. An operation 1305 is then performed to etch the layer of the second material so as to leave a filament of the second material on each sidewall of each of the linear-shaped core structures and so as to remove the second material from the underlying material.

The method further includes an operation 1307 for depositing a third material over each filament of the second material. Then, in an operation 1309, a portion of the third material is removed so as to expose one or more filaments of the second material. The method continues with an operation 1311 for etching the exposed filaments of the second material so as to leave thinner filaments of the second material. The method also includes an operation 1313 for removing the third material and the plurality of linear-shaped core structures of the first material so as to leave the filaments of the second material on the underlying material, whereby the filaments of the second material provides a mask for etching the underlying material.

In one embodiment, each of the plurality of linear-shaped core structures of the first material is formed on the underlying material in operation 1301 using a mask material patterned by an optical lithography process. In this embodiment, the filaments of the second material on the underlying material collectively have dimensions and spacings too small to be directly formed by the optical lithography process. In another embodiment, each of the plurality of linear-shaped core structures of the first material is formed on the underlying material in operation 1301 using a multiple mask patterning process. In this embodiment, each mask of the multiple mask patterning process is formed by an optical lithography process. Also, in this embodiment, the filaments of the second material on the underlying material collectively have dimensions and spacings too small to be directly formed by the optical lithography process.

It should be appreciated that the first material and the second material have different etching selectivities to enable removal of the first material without substantial removal of the second material during a given etching process. In one embodiment, etching the layer of the second material in operation 1305 includes removing the second material from a top surface of each of the plurality of linear-shaped core structures of the first material so as to expose the top surface of each of the plurality of linear-shaped core structures of the first material. In one embodiment, etching the layer of the second material in one or both of operations 1305 and 1311 can include biasing an etching front in a direction toward the underlying material.

In one embodiment, the method further includes an operation in which a cut mask is formed over the filaments of the second material so as to expose portions of the filaments of the second material for removal, so as to form ends of linear segments of the filaments of the second material. This embodiment also includes an operation for removing exposed portions of the filaments of the second material, whereby the linear segments of the filaments of the second material provide the mask for etching the underlying material.

In one embodiment, conformally depositing the layer of the second material over each of the linear-shaped core structures and exposed portions of the underlying material in operation 1303 includes conformally depositing multiple sub-layers of the second material. In this embodiment, each boundary between the multiple sub-layers of the second material provides an etch stop for a subsequent etching of the second material.

Figure 14:
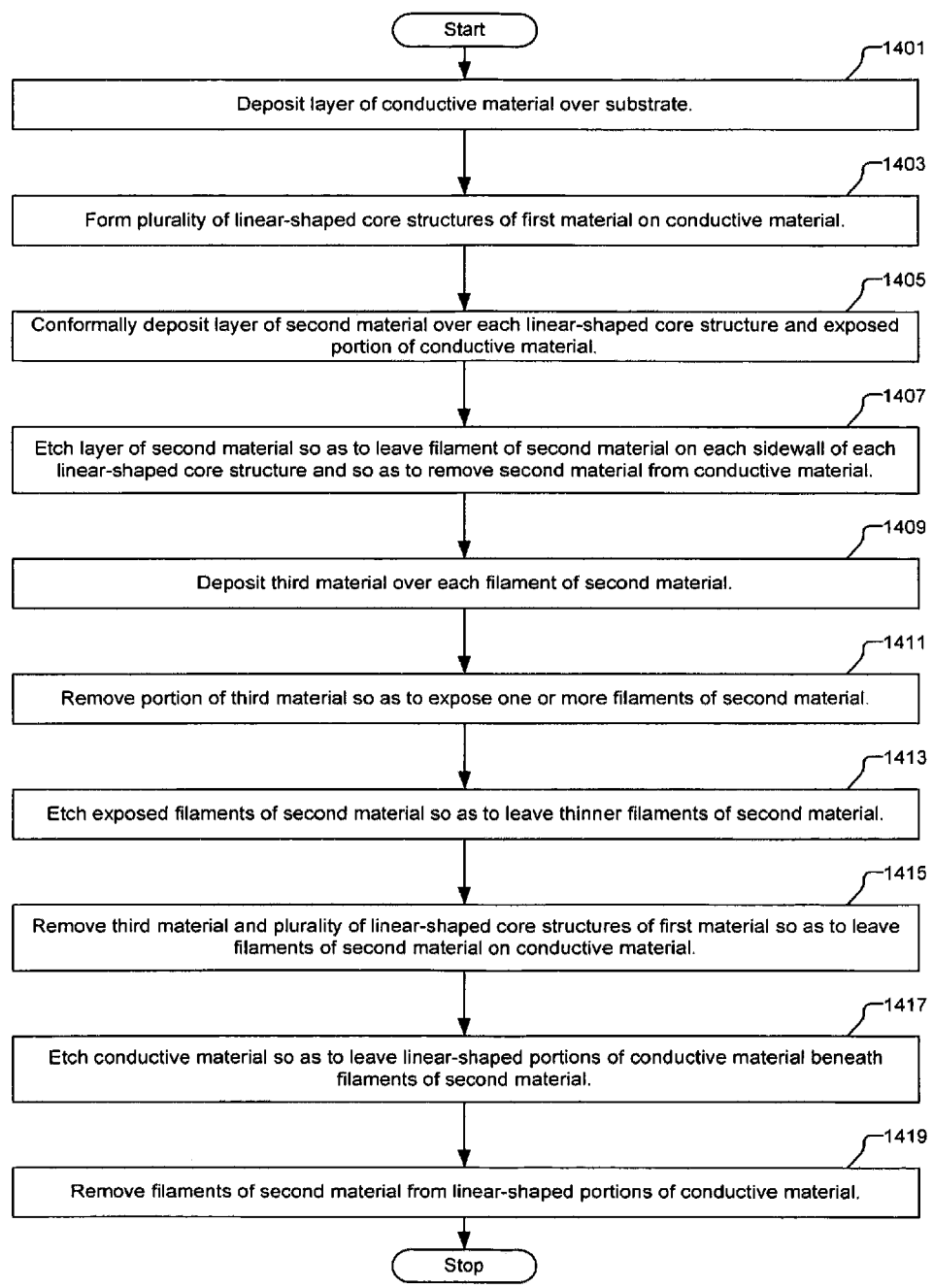
FIG. 14 shows a flowchart of a method for fabricating linear-shaped conductive structures for an integrated circuit, in accordance with one embodiment of the present invention.

FIG. 14 shows a flowchart of a method for fabricating linear-shaped conductive structures for an integrated circuit, in accordance with one embodiment of the present invention. The method includes an operation 1401 for depositing a layer of a conductive material over a substrate. The method also includes an operation 1403 in which a plurality of linear-shaped core structures of a first material are formed on the conductive material. The method also includes an operation 1405 for conformally depositing a layer of a second material over each of the linear-shaped core structures and exposed portions of the conductive material. The method also includes an operation 1407 for etching the layer of the second material so as to leave a filament of the second material on each sidewall of each of the linear-shaped core structures and so as to remove the second material from the conductive material. The method also includes an operation 1409 for depositing a third material over each filament of the second material. The method also includes an operation 1411 for removing a portion of the third material to as to expose one or more of the filaments of the second material. The method also includes an operation 1413 for etching the exposed filaments of the second material so as to leave thinner filaments of the second material. The method also includes an operation 1415 for removing the third material and the plurality of linear-shaped core structures of the first material so as to leave the filaments of the second material on the conductive material, whereby the filaments of the second material provide a mask for etching the conductive material. The method also includes an operation 1417 for etching the conductive material so as to leave linear-shaped portions of the conductive material beneath the filaments of the second material. The method also includes an operation 1419 for removing the filaments of the second material from the linear-shaped portions of the conductive material.

In one embodiment, the linear-shaped core structure of the first material is formed on the conductive material in operation 1403 using an optical lithography process. In this embodiment, the filaments of the second material on the conductive material collectively have dimensions and spacings too small to be directly formed by the optical lithography process.

It should be appreciated that the first material and the second material have different etching selectivities to enable removal of the first material without substantial removal of the second material during a given etching process. Also, in one embodiment, etching the layer of the second material in operation 1407 includes biasing an etching front in a direction toward the conductive material.

In one embodiment, the method also includes an operation in which a cut mask is formed over the filaments of the second material so as to expose portions of the filaments of the second material for removal, so as to form ends of linear segments of the filaments of the second material. Also, in this embodiment, an operation is performed to remove exposed portions of the filaments of the second material, whereby the linear segments of the filaments of the second material provide the mask for etching the conductive material.

It should be understood that the methods disclosed herein can be used to create sidewall filaments having a thickness of less than or equal to 30 nanometers (nm), in various embodiments. Because the sidewall filaments provide a mask for fabricating underlying structures, it should be understood that the thickness of the sidewall filaments as measured horizontal to the substrate determines the size, e.g., critical dimension, of the underlying structures. For a 32 nm process node, the minimum as-drawn structure size is about 30 nm, which can be incremented by about 10% to obtain structure sizes of about 34 nm, 38 nm, etc. Also, with a 90% scaling process, the 30 nm minimum as-drawn structure size can be decreased to obtain about a 28 nm structure size. Therefore, at the 32 nm process node with the 90% scaling process applied, sidewall filaments can be formed to fabricate structure sizes of 28 nm, 32 nm, 36 nm, etc. For a 22 nm process node, the minimum as-drawn structure size is about 20 nm, which can be incremented by about 10% to obtain structure sizes of about 22 nm, 24 nm, etc. Also, with a 90% scaling process, the 20 nm minimum as-drawn structure size can be decreased to obtain about a 18 nm structure size. Therefore, at the 22 nm process node with the 90% scaling process applied, sidewall filaments can be formed to fabricate structure sizes of 18 nm, 20 nm, 22 nm, etc. For a 16 nm process node, the minimum as-drawn structure size is about 14 nm, which can be incremented by about 10% to obtain structure sizes of about 16 nm, 18 nm, etc. Also, with a 90% scaling process, the 14 nm minimum as-drawn structure size can be decreased to obtain about a 12 nm structure size. Therefore, at the 16 nm process node with the 90% scaling process applied, sidewall filaments can be formed to fabricate structure sizes of 12 nm, 14 nm, 16 nm, etc. It should be appreciated that structure size fabrication capabilities of future process nodes can be scaled by a factor of about 0.7 to about 0.8.

It should be understood that layout features associated with the methods disclosed herein can be implemented in a layout that is stored in a tangible form, such as in a digital format on a computer readable medium. For example, the layouts incorporating the layout features associated with the methods disclosed herein can be stored in a layout data file of one or more cells, selectable from one or more libraries of cells. The layout data file can be formatted as a GDS II (Graphic Data System) database file, an OASIS (Open Artwork System Interchange Standard) database file, or any other type of data file format suitable for storing and communicating semiconductor device layouts. Also, multi-level layouts including the layout features associated with the methods disclosed herein can be included within a multi-level layout of a larger semiconductor device. The multi-level layout of the larger semiconductor device can also be stored in the form of a layout data file, such as those identified above.

Also, the invention described herein can be embodied as computer readable code on a computer readable medium. For example, the computer readable code can include the layout data file within which one or more layouts including layout features associated with the methods disclosed herein are stored. The computer readable code can also include program instructions for selecting one or more layout libraries and/or cells that include a layout including layout features associated with the methods disclosed herein. The layout libraries and/or cells can also be stored in a digital format on a computer readable medium.

The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the layout features associated with the methods disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for fabricating a mask for etching of linear-shaped structures for an integrated circuit, comprising:
   forming a plurality of linear-shaped core structures of a first material on an underlying material, the plurality of linear-shaped core structures formed to extend lengthwise in a parallel manner so as to have commonly oriented lengthwise sidewalls;

after forming the plurality of linear-shaped core structures of the first material, conformally depositing a layer of a second material over each of the linear-shaped core structures and exposed portions of the underlying material;

after conformally depositing the layer of the second material, etching the layer of the second material so as to leave a filament of the second material on each lengthwise sidewall of each of the linear-shaped core structures and so as to remove the second material from the underlying material;

after etching the layer of the second material, depositing a third material over each filament of the second material;

after depositing the third material, removing a portion of the third material so as to expose an entirety of at least one of the plurality of linear-shaped core structures of the first material and an entirety of each of the filaments of the second material present along each of its lengthwise sidewalls;

after removing the portion of the third material, etching the exposed filaments of the second material so as to leave thinner filaments of the second material as measured in a direction perpendicular to the lengthwise sidewalls of the plurality of linear-shaped core structures; and after etching the exposed filaments of the second material so as to leave thinner filaments of the second material, removing the third material and the plurality of linear-shaped core structures of the first material so as to leave the filaments of the second material on the underlying material, whereby the filaments of the second material provides a mask for etching the underlying material.

2. The method as recited in claim 1, wherein each of the plurality of linear-shaped core structures of the first material is formed on the underlying material using an optical lithography process, and wherein the filaments of the second material on the underlying material collectively have dimensions and spacings too small to be directly formed by the optical lithography process.

3. The method as recited in claim 1, wherein each of the plurality of linear-shaped core structures of the first material is formed on the underlying material using a multiple mask patterning process, wherein each mask of the multiple mask patterning process is formed by an optical lithography process, and wherein the filaments of the second material on the underlying material collectively have dimensions and spacings too small to be directly formed by the optical lithography process.

4. The method as recited in claim 1, wherein etching the layer of the second material includes removing the second material from a top surface of each of the plurality of linear-shaped core structures of the first material so as to expose the top surface of each of the plurality of linear-shaped core structures of the first material.

5. The method as recited in claim 1, wherein the first material and the second material have different etching selectivities to enable removal of the first material without substantial removal of the second material during a given etching process.

6. The method as recited in claim 1, wherein etching the layer of the second material includes biasing an etching front in a direction toward the underlying material.

7. The method as recited in claim 1, further comprising:
forming a cut mask over the filaments of the second material so as to expose portions of the filaments of the second material for removal so as to form ends of linear segments of the filaments of the second material; and removing exposed portions of the filaments of the second material, whereby the linear segments of the filaments of the second material provide the mask for etching the underlying material.

8. The method as recited in claim 1, wherein conformally depositing the layer of the second material over each of the linear-shaped core structures and exposed portions of the underlying material includes conformally depositing multiple sub-layers of the second material, wherein each boundary between the multiple sub-layers of the second material provides an etch stop for a subsequent etching of the second material.

9. A method for fabricating linear-shaped conductive structures for an integrated circuit, comprising:
depositing a layer of a conductive material over a substrate;

after depositing the layer of the conductive material, forming a plurality of linear-shaped core structures of a first material on the conductive material, the plurality of linear-shaped core structures formed to extend lengthwise in a parallel manner so as to have commonly oriented lengthwise sidewalls;

after forming the plurality of linear-shaped core structures of the first material, conformally depositing a layer of a second material over each of the linear-shaped core structures and exposed portions of the conductive material;

after conformally depositing the layer of the second material, etching the layer of the second material so as to leave a filament of the second material on each lengthwise sidewall of each of the linear-shaped core structures and so as to remove the second material from the conductive material;

after etching the layer of the second material, depositing a third material over each filament of the second material;

after depositing the third material, removing a portion of the third material so as to expose an entirety of at least one of the plurality of linear-shaped core structures of the first material and an entirety of each of the filaments of the second material present along each of its lengthwise sidewalls;

after removing the portion of the third material, etching the exposed filaments of the second material so as to leave thinner filaments of the second material as measured in a direction perpendicular to the lengthwise sidewalls of the plurality of linear-shaped core structures;

after etching the exposed filaments of the second material so as to leave thinner filaments of the second material, removing the third material and the plurality of linear-shaped core structures of the first material so as to leave the filaments of the second material on the conductive material, whereby the filaments of the second material provide a mask for etching the conductive material;

after removing the third material and the plurality of linear-shaped core structures of the first material, etching the conductive material so as to leave linear-shaped portions of the conductive material beneath the filaments of the second material; and after etching the conductive material, removing the filaments of the second material from the linear-shaped portions of the conductive material.

10. The method as recited in claim 9, wherein the linear-shaped core structure of the first material is formed on the conductive material using an optical lithography process, and wherein the filaments of the second material on the conductive material collectively have dimensions and spacings too small to be directly formed by the optical lithography process.

11. The method as recited in claim 9, wherein the first material and the second material have different etching selectivities to enable removal of the first material without substantial removal of the second material during a given etching process.

12. The method as recited in claim 9, wherein etching the layer of the second material includes biasing an etching front in a direction toward the conductive material.

13. The method as recited in claim 9, further comprising:
    forming a cut mask over the filaments of the second material so as to expose portions of the filaments of the second material for removal so as to form ends of linear segments of the filaments of the second material; and
    removing exposed portions of the filaments of the second material, whereby the linear segments of the filaments of the second material provide the mask for etching the conductive material.

* * * * *